US008411253B2

(12) United States Patent
Sekine et al.

(10) Patent No.: US 8,411,253 B2
(45) Date of Patent: Apr. 2, 2013

(54) COMPUTER READABLE MEDIUM AND EXPOSURE METHOD

(75) Inventors: Yoshiyuki Sekine, Utsunomiya (JP); Kenji Yamazoe, Berkeley, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 420 days.

(21) Appl. No.: 12/492,736

(22) Filed: Jun. 26, 2009

(65) Prior Publication Data

US 2010/0053580 A1    Mar. 4, 2010

(30) Foreign Application Priority Data

Jul. 15, 2008 (JP) ................................. 2008-184152

(51) Int. Cl.
  *G03B 27/32* (2006.01)
(52) U.S. Cl. ........................................................ 355/77
(58) Field of Classification Search .................. 355/77
  See application file for complete search history.

(56) References Cited

U.S. PATENT DOCUMENTS

| | | | |
|---|---|---|---|
| 6,223,139 B1 | 4/2001 | Wong et al. | |
| 6,738,859 B2 | 5/2004 | Liebchen | |
| 6,871,337 B2 | 3/2005 | Socha | |
| 8,059,262 B2 * | 11/2011 | Yamazoe | 355/77 |
| 2002/0062206 A1 | 5/2002 | Liebchen | |
| 2004/0229133 A1 | 11/2004 | Socha et al. | |
| 2004/0265707 A1 | 12/2004 | Socha | |
| 2006/0204090 A1 | 9/2006 | Socha et al. | |
| 2008/0052334 A1 * | 2/2008 | Yamazoe | 708/191 |
| 2009/0091736 A1 * | 4/2009 | Yamazoe | 355/77 |
| 2010/0037199 A1 * | 2/2010 | Yamazoe et al. | 716/19 |
| 2010/0053580 A1 * | 3/2010 | Sekine et al. | 355/53 |

FOREIGN PATENT DOCUMENTS

| | | |
|---|---|---|
| EP | 1473596 A2 | 11/2004 |
| EP | 1903389 A1 | 3/2008 |
| JP | 07220995 A | 8/1995 |
| JP | 11237310 A | 8/1999 |
| JP | 2004221594 A | 8/2004 |
| JP | 2007520892 T | 7/2007 |
| JP | 2007273560 A | 10/2007 |
| TW | 200502705 A | 1/2005 |
| TW | 200502709 A | 1/2005 |

OTHER PUBLICATIONS

N. Cobb, "Sum of Coherent Systems Decomposition by SVD", Univ. of California at Berkley, Sep. 21, 1995, pp. 1-7.

(Continued)

*Primary Examiner* — Thomas R Artman
(74) *Attorney, Agent, or Firm* — Canon U.S.A., Inc. IP Division

(57) ABSTRACT

A computer readable medium containing computer-executable instructions which cause a computer to execute processing steps that calculate a light intensity distribution formed on an image plane of a projection optical system. When executed, the medium causes a computer to execute the steps of dividing an effective light source into the plurality of areas, generating, for each of the plurality of areas, a plurality of shifted pupil functions by shifting a pupil function in accordance with a position of each of divided point sources, defining, for each of the plurality of areas, a matrix including the plurality of pupil functions, calculating, for each of the plurality of areas, eigenvalues and eigenfunctions by performing singular value decomposition of the matrix, and calculating, for each of the plurality of areas, the light intensity distribution based on a diffracted light distribution from the mask and the eigenvalues and the eigenfunctions.

11 Claims, 12 Drawing Sheets

OTHER PUBLICATIONS

R. Socha, "Propagation Effects of Partially Coherent Light in Optical Lithography and Inspection", Univ. of California at Berkley, 1997, pp. 1-98.

N. Cobb, "Fast Optical and Process Proximity Correction Algorithms for Integrated Circuit Manufacturing", Univ. of California at Berkeley, 1998, pp. 1-123.

R. Socha et al., "Contact Hole Reticle Optimization by Using Interference Mapping Lithography", Proceedings of SPIE, 2004, pp. 222-240, vol. 5377.

R. Socha et al., "Simultaneous Source Mask Optimization (SMO)", Proceedings of SPIE, 2005, pp. 180-193, vol. 5853.

K. Yamazoe et al., "Resolution enhancement by aerial image approximation with 2D-TCC", Proceedings of SPIE, 2007, pp. 67302H1-67302H12, vol. 6730.

U.S. Appl. No. 12/241,702, filed Sep. 30, 2008 Kenji Yamazoe.

Full-Chip Lithography Simulation and Design Analysis-How OPC is Changing IC Design,Proc. of SPIE,USA,SPIE press,2005, Chris Spence, vol. 5751, pp. 1-14.

Optical Imaging in Projection Microlithography,SPIE press,2005, Alfred Kwok-kit Wong, pp. 151-163.

\* cited by examiner

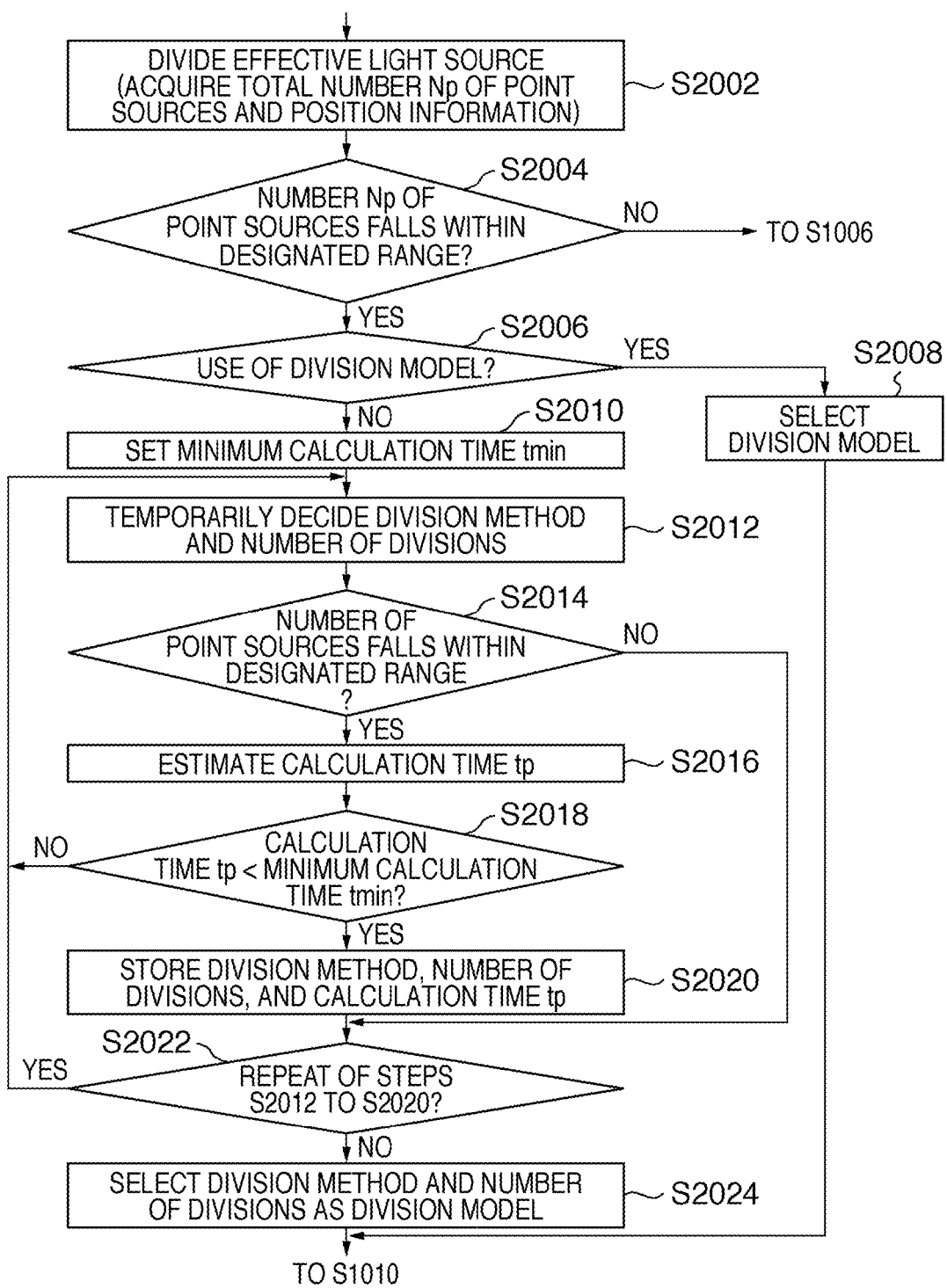

COMPUTER READABLE MEDIUM AND EXPOSURE METHOD

BACKGROUND OF THE INVENTION

1. Field of the Invention

The present invention relates to a computer readable medium and an exposure method.

2. Description of the Related Art

To manufacture semiconductor devices by photolithography, projection exposure apparatuses are used which project a circuit pattern drawn on a mask (or reticle) onto a substrate such as a wafer via a projection optical system, thereby transferring the circuit pattern. Recent advanced microfabrication technologies for semiconductor devices require improved resolutions (higher resolutions) of the projection exposure apparatuses.

Increasing the NA (Numerical Aperture) of the projection optical system and shortening the wavelength of exposure light are conventionally known means for achieving a higher resolution of a projection exposure apparatus. RET (Resolution Enhanced Technology) is also attracting attention, which improves the resolution of a projection exposure apparatus by reducing a k1 factor (also called a "process constant").

As the k1 factor becomes smaller, exposure becomes more difficult. In prior arts, exposure (e.g., exposure conditions and exposure method) is optimized by repeating experiments several times and confirming the possibility of exposure (i.e., whether it is possible to faithfully project the circuit pattern). However, the difficulty level of exposure has now risen, and experiments to confirm the exposure possibility waste time and cost. Instead, exposure is optimized presently by repeating exposure simulations using a computer. The mainstream of such simulations is so-called model-based RET which performs simulations based on physical models of optics from simulations based on predetermined rules.

The model-based RET generally uses partially coherent imaging calculation. When the partially coherent imaging calculation speeds up, the time required for the model-based RET (simulations) shortens. In the current advanced computer environments, a technique of increasing the calculation speed by parallelizing a plurality of computers has been proposed. Another proposal is a technique of speeding up calculations more effectively by improving the algorithm to execute the partially coherent imaging calculation than by computer parallelization.

For example, Cris Spence, "Full-Chip Lithography Simulation and Design Analysis—How OPC is Changing IC Design", Proc. of SPIE, USA, SPIE press, 2005, Vol. 5751, pp. 1-14 (reference 1) reports that the SOCS algorithm has increased the calculation speed (simulation speed) by 10,000 times. Alfred Kwok-kit Wong, "Optical Imaging in Projection Microlithography", USA, SPIE press, 2005, pp. 151-163 (reference 2) describes the partially coherent imaging calculation but presents no algorithm for realizing a calculation speed more than that of the SOCS algorithm. Note that the SOCS is called Coherent Decomposition in reference 2.

However, the SOCS takes time to calculate a TCC (Transmission Cross Coefficient) or decompose an eigenvalue and eigenfunction.

SUMMARY OF THE INVENTION

The present invention provides a technique of calculating a light intensity distribution formed on the image plane of a projection optical system in a short time.

According to one aspect of the present invention, there is provided a computer readable medium containing computer-executable instructions which cause a computer to execute processing steps that calculate a light intensity distribution formed on an image plane of a projection optical system when illuminating a mask using an illumination optical system and projecting an image of a pattern of the mask onto a substrate through the projection optical system. The computer readable medium includes computer-executable instructions that determine whether to divide an effective light source into a plurality of areas, the effective light source being formed on a pupil plane of the projection optical system when the mask is not arranged on an object plane of the projection optical system; computer-executable instructions that divide the effective light source into the plurality of areas upon determining to divide the effective light source into the plurality of areas; computer-executable instructions that generate, for each of the plurality of areas, a plurality of shifted pupil functions by shifting a pupil function representing a pupil of the projection optical system in accordance with a position of each of divided point sources; computer-executable instructions that define, for each of the plurality of areas, a matrix including the plurality of pupil functions generated in the generating step; computer-executable instructions that calculate, for each of the plurality of areas, eigenvalues and eigenfunctions by performing singular value decomposition of the matrix defined in the defining step; computer-executable instructions that calculate, for each of the plurality of areas, the light intensity distribution formed on the image plane of the projection optical system based on a diffracted light distribution of light diffracted by the pattern of the mask and the eigenvalues and the eigenfunctions calculated in the step of calculating the eigenvalues and the eigenfunctions; and computer-executable instructions that composite the light intensity distributions of the plurality of areas which are calculated in the step of calculating the light intensity distributions.

Further features and aspects of the present invention will become apparent from the following description of exemplary embodiments with reference to the attached drawings.

BRIEF DESCRIPTION OF THE DRAWINGS

FIG. 5 is a flowchart for explaining details of effective light source division determination in step S1004 of FIG. 4.

DESCRIPTION OF THE EMBODIMENTS

Figure 1:
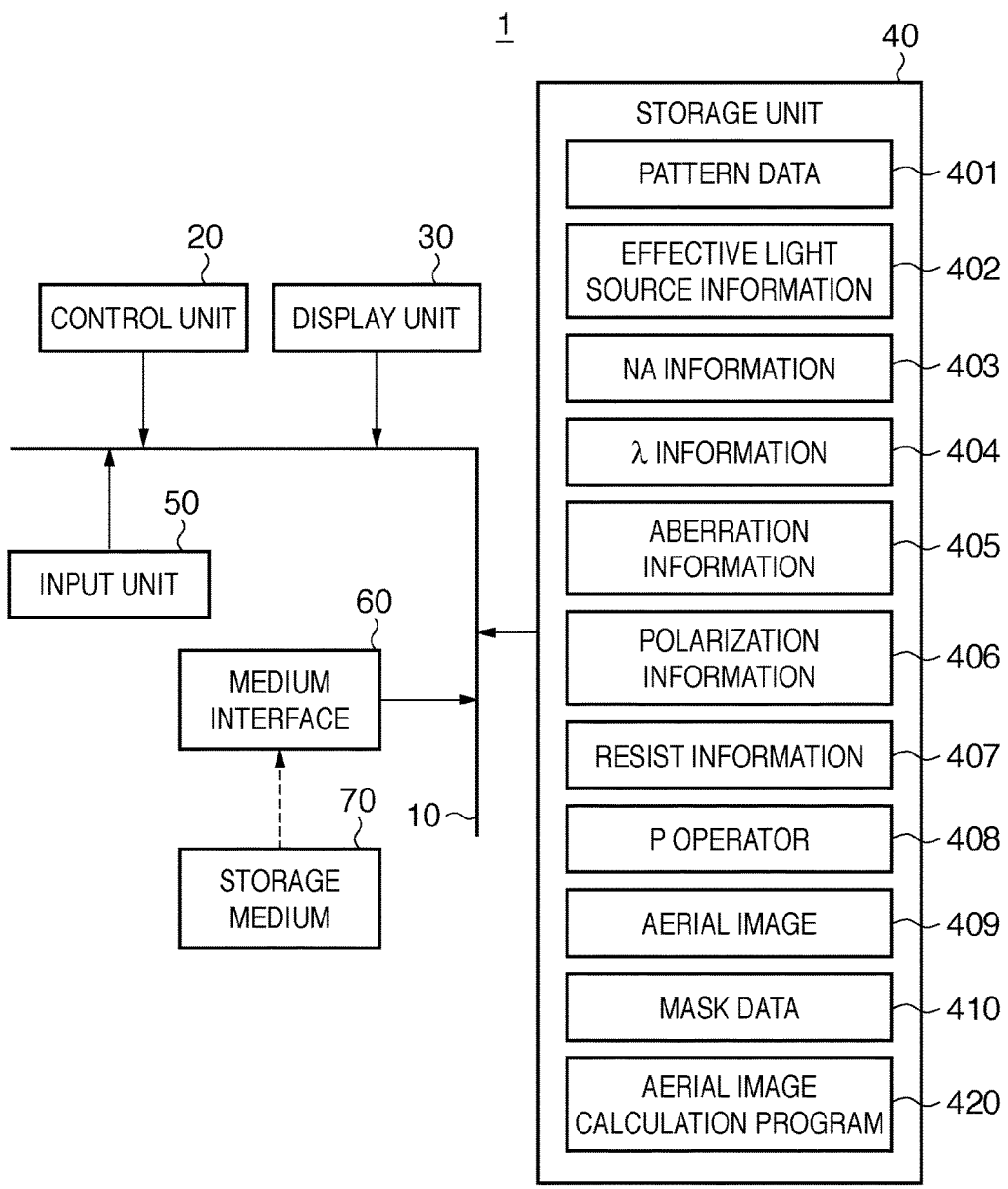
FIG. 1 is a schematic block diagram showing the arrangement of a processing apparatus for executing a calculation method according to an aspect of the present invention.

Various embodiments of the present invention will now be described with reference to the accompanying drawings. The same reference numerals denote the same parts throughout the drawings, and a repetitive description thereof will be omitted.

The present invention is applicable to imaging calculation (partially coherent imaging calculation) of an optical system based on partially coherent imaging in, for example, an exposure apparatus or a microscope. The present invention is also applicable to generation of data of a mask to be used for micromechanics or manufacture of various kinds of devices including semiconductor chips such as an IC and LSI, display elements such as a liquid crystal panel, detection elements such as a magnetic head, and image sensing elements such as a CCD. Note that the micromechanics indicates a technique of manufacturing a micron-order mechanical system having advanced functions by applying semiconductor integrated circuit manufacturing techniques to form a microstructure, or the mechanical system itself.

The concepts disclosed in the present invention can mathematically be modeled and thus implemented as the software function of a computer system. The software function of a computer system includes programming containing executable software codes and executes partially coherent imaging calculation in this embodiment. The software codes are executed by the processor of the computer system. When the software codes are running, the codes and associated data are stored in the computer platform.

The software codes may be stored in another place or loaded to an appropriate computer system. Hence, the software codes can be held in a computer-readable recording medium as one or a plurality of modules. The present invention can be described in a form of codes as described above and function as one or a plurality of software products.

The coordinate systems of the exposure apparatus according to this embodiment will be explained. The coordinate systems of the exposure apparatus are roughly classified into two types in the embodiment.

The first coordinate system indicates coordinates on the mask plane (the object plane of the projection optical system) and the wafer plane (the image plane of the projection optical system), which are represented by (x,y) in this embodiment. The size of a pattern on the mask plane and that of a pattern on the wafer plane are different by the scaling factor of the projection optical system. For the descriptive convenience, the size of a pattern on the mask plane is multiplied by the scaling factor of the projection optical system so that a one-to-one correspondence holds between the size of the pattern on the mask plane and that of a pattern on the wafer plane. Accordingly, the coordinate system on the mask plane and that on the wafer plane also have a one-to-one correspondence.

The second coordinate system indicates coordinates on the pupil plane of the projection optical system, which are represented by (f,g) in this embodiment. The coordinates (f,g) on the pupil plane of the projection optical system form a coordinate system that normalizes the radius of the pupil of the projection optical system to 1.

In the exposure apparatus, a light intensity distribution formed on the pupil plane of the projection optical system without plating a mask on the object plane of the projection optical system is called an effective light source which is represented by S(f,g) in this embodiment. In the embodiment, the pupil of the projection optical system is expressed by a pupil function P(f,g). It is possible to incorporate the influence (information) of aberrations and polarizations into a pupil function. In general, a pupil function includes the influence of aberrations and polarizations.

The exposure apparatus illuminates a mask with partially coherent illumination and projects the pattern of the mask (mask pattern) onto a wafer. In this embodiment, a mask pattern including a transmittance and phase information is defined by o(x,y). A light intensity distribution (aerial image) formed on the wafer plane is defined by I(x,y). The amplitude of light diffracted by the mask pattern is defined by the pupil plane of the projection optical system and represented by a(f,g) in this embodiment.

Conventional partially coherent imaging calculation will be described. Conventional methods of calculating partially coherent imaging (calculating a light intensity distribution on the image plane of the projection optical system) can roughly be divided into three types.

The first calculation method is a light source plane integrating method (so-called Abbe method). More specifically, the light source plane integrating method calculates the light intensity distribution I(x,y) by $$I(x, y) = \sum_{i=1}^{N_1} S(f_i', g_i') |F[P(f, g)a(f - f_i', g - g_i')]|^2 \quad (1)$$

where $N_1$ is the number of point sources in numerical calculation, and F is Fourier transform.

The second calculation method performs calculation without eigenvalue decomposition of a TCC. The TCC is defined by $$TCC(f', g', f'', g'') = \iint S(f, g)P(f+f', g+g')P^*(f+f'', g+g'') \, df dg \quad (2)$$

As is apparent from equation (2), the TCC is a four-dimensional function. Using the TCC, the light intensity distribution I(x,y) can be calculated by $$I(x, y) = \sum_{i,j,k,l=1}^{N_2} TCC(f_i', g_j', f_k'', g_l'')a(f_i', g_j') \\ a^*(f_k'', g_l'') \times \exp[-i2\pi\{(f_i' - f_k'')x + (g_j' - g_l'')y\}] \quad (3)$$

where $N_2$ is a type (number) i, j, k, and l can take, and depends on the number of pupil divisions in numerical calculation.

The third method is called SOCS which decomposes the TCC represented by equation (2) into a plurality of eigenvalue and eigenfunctions. Let $\lambda_i$ be the ith eigenvalue, and $\Psi_i$ is the ith eigenfunction.

The light intensity distribution I(x,y) can be calculated by $$I(x, y) = \sum_{i=1}^{N_3} \lambda_i |F[\Psi_i(f, g) a(f, g)]|^2 \quad (4)$$

where $N_3$ is the number of point sources in numerical calculation.

The light source plane integrating method is suitable for small-scale calculations (small-scale simulations). More specifically, the light source plane integrating method is suitable for simulations associated with part of a mask or checking the manner the imaging performance changes depending on the difference in optical settings (e.g., effective light source, aberration, and polarization).

The calculation method using a TCC, i.e., the calculation method using equation (3) needs quadruple integrations and is therefore slower than the light source plane integrating method and the SOCS. The SOCS obtains a light intensity distribution without executing quadruple integrations. The SOCS is suitable for large-scale calculations (large-scale simulations).

Large-scale calculation is done by dividing a mask into a plurality of areas. If optical settings (e.g., effective light source, aberration, and polarization) do not change, the TCC of equation (2) does not change, and the eigenfunction $\Psi_i$ in equation (4) does not change, either. Once the eigenvalue $\lambda_i$ and the eigenfunction $\Psi_i$ are obtained, two-dimensional Fourier transform and simple calculation of obtaining a square-sum are repeated regardless of a change of the mask, i.e., diffracted light amplitude a(f,g). For this reason, the SOCS is suitable for large-scale calculations that change only the mask.

On the other hand, as can be seen from equation (2), it is necessary to execute double integration to calculate the TCC (that is, the TCC is a four-dimensional function). For this reason, the SOCS takes time to calculate the TCC and requires an enormous computer memory. The SOCS also takes time to calculate the eigenvalue $\lambda_i$ and the eigenfunction $\Psi_i$. If the optical settings (e.g., effective light source, aberration, and polarization) have changed, the SOCS must recalculate the TCC. For these reasons, the SOCS is not suitable for checking changes in imaging performance by changing the optical settings (small-scale calculations).

As described above, the conventional techniques require a long time for simulations. The prior arts need to selectively use the light source plane integrating method and the SOCS depending on the calculation target (i.e., small-scale calculation or large-scale calculation).

FIG. 1 is a schematic block diagram showing the arrangement of a processing apparatus 1 for executing a calculation method according to an aspect of the present invention.

The processing apparatus 1 is formed from, for example, a general-purpose computer, and includes a bus line 10, control unit 20, display unit 30, storage unit 40, input unit 50, and medium interface 60, as shown in FIG. 1.

The bus line 10 connects the control unit 20, display unit 30, storage unit 40, input unit 50, and medium interface 60 to each other.

The control unit 20 is formed from, for example, a CPU, GPU, DSP, or microcomputer, and includes a cache memory for temporary storage.

The display unit 30 includes a display device such as a CRT display or a liquid crystal display.

The storage unit 40 includes, for example, a memory or a hard disk. In this embodiment, the storage unit 40 stores pattern data 401, effective light source information 402, NA information 403, λ information 404, aberration information 405, polarization information 406, and resist information 407. The storage unit 40 also stores a P operator 408, aerial image 409, mask data 410, and aerial image calculation program 420.

The pattern data 401 is the data of a layout-designed pattern (layout pattern or target pattern) in settings of an integrated circuit or the like.

The effective light source information 402 is information about a light intensity distribution (effective light source) formed on the pupil plane of the projection optical system of the exposure apparatus.

The NA information 403 is information about the NA (Numerical Aperture) on the image plane side of the projection optical system of the exposure apparatus.

The λ information 404 is information about the wavelength of light (exposure light) emitted by the light source of the exposure apparatus.

The aberration information 405 is information about the aberration of the projection optical system of the exposure apparatus.

The polarization information 406 is information about the polarization (illumination light polarized state) of light formed by the illumination apparatus (illumination optical system) of the exposure apparatus.

The resist information 407 is information about a resist applied to a wafer.

The P operator 408 is a matrix which is necessary for a process (i.e., aerial image calculation program 420) of calculating an aerial image that is a light intensity distribution formed on the wafer plane, as will be described later.

The aerial image 409 is the calculation result of an aerial image (light intensity distribution) by the aerial image calculation program 420.

The mask data 410 is the data of an actual mask (reticle). Note that the mask data 410 is generally different from the pattern data 401.

The aerial image calculation program 420 is a program of calculating an aerial image (light intensity distribution).

The input unit 50 includes, for example, a keyboard and a mouse.

The medium interface 60 includes, for example, a flexible disk drive, CD-ROM drive, and USB interface and is configured to be connectable to a storage medium 70. Note that the storage medium 70 is, for example, a flexible disk, CD-ROM, or USB memory.

Calculation of the aerial image 409 by the aerial image calculation program 420 will be described below especially focusing on the P operator 408. In this embodiment, let λ be the wavelength of exposure light, and NA be the numerical aperture on the image plane side of the projection optical system. Also, let σ be the ratio of the numerical aperture of illumination light that is emitted from the illumination optical system and enters the mask plane to the numerical aperture on the object plane side of the projection optical system.

The mask pattern and the aerial image in the exposure apparatus have a relationship of partially coherent imaging. Partially coherent imaging calculation methods are roughly classified into three types (equations (1), (3) and (4)), as described above. Equations (1) and (4) use the Fourier transform F. From the viewpoint of Fourier optics, an aerial image can be regarded to be the sum of plane waves. A plane wave is expressed by exp[−i2π(fx+gy)]. Equation (3) does not clearly exhibit the Fourier transform F but includes the plane wave $\exp[-i2\pi(fx+gy)]$. Hence, an aerial image can be regarded to be the sum of plane waves.

As described above, partially coherent imaging is supposed to be based on the plane wave $\exp[-i2\pi(fx+gy)]$ optically. On the other hand, the plane wave $\exp[-i2\pi(fx+gy)]$ is mathematically a complete orthogonal system. In this embodiment, the aerial image 409 is calculated in a shorter time using the property that a plane wave is a complete orthogonal system.

An example will be described in which a one-dimensional aerial image (light intensity distribution) is calculated. In this case, the plane wave can be represented by $\exp(-i2\pi fx)$. The complete orthogonal system is defined by a vector $$|\phi\rangle = \begin{pmatrix} e^{-i2\pi f_1 x} \\ e^{-i2\pi f_2 x} \\ \vdots \\ e^{-i2\pi f_M x} \end{pmatrix} \tag{5}$$

where M is the number of divisions of the range of f ($-2 \leq f \leq 2$) in numerical calculation.

Figure 2:
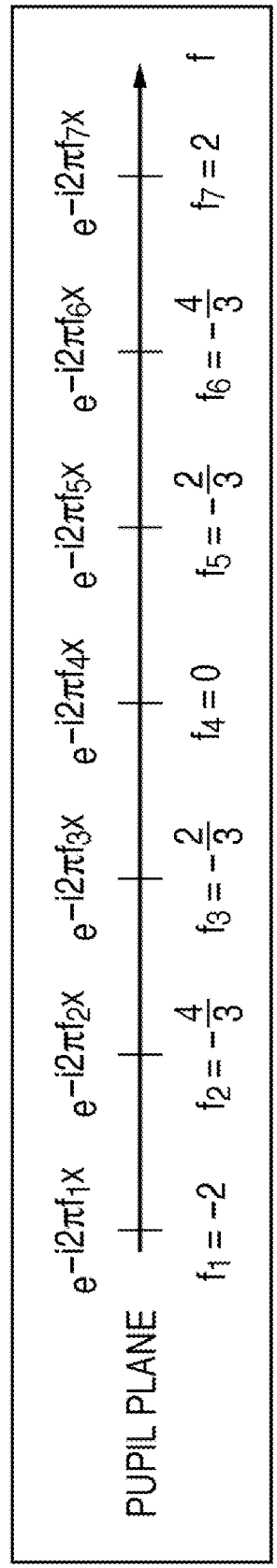
FIG. 2 is a view schematically showing a one-dimensional plane wave (complete orthogonal system).

The P operator 408 will be described. In this embodiment, M in equation (5) is 7. Hence, $f_1=-2$, $f_2=-4/3$, $f_3=-2/3$, $f_4=0$, $f_5=2/3$, $f_6=4/3$, and $f_7=2$, as shown in FIG. 2. FIG. 2 is a view schematically showing a one-dimensional plane wave (complete orthogonal system).

Using the amplitude $a(f)$ of light diffracted by the mask pattern, the plane wave from $f_i$ to the image plane can be represented by $a(f_i)\exp(-i2\pi f_i x)$. Hence, a vector (i.e., the vector of diffracted light) $|\phi'\rangle$ which expresses, as overlap of plane waves, light that has arrived at the image plane from the diffracted light distribution on the pupil plane of the projection optical system is given by $$|\phi\rangle = \begin{pmatrix} a(f_1) & 0 & \cdots & 0 \\ 0 & a(f_2) & & 0 \\ \vdots & & \ddots & 0 \\ 0 & 0 & \cdots & a(f_7) \end{pmatrix} \begin{pmatrix} e^{-2\pi f_1 x} \\ e^{-2\pi f_2 x} \\ \vdots \\ e^{-2\pi f_7 x} \end{pmatrix} \tag{6}$$

$$= A|\phi\rangle$$

where A is a diagonal matrix having the amplitude $a(f_i)$ of diffracted light as a diagonal component.

If the projection optical system has no aberration, its pupil has a function of directly passing diffracted light within the range of $-1 \leq f \leq 1$ and shielding diffracted light within the range of $|f|>1$. Causing light to emit from a point f' on the effective light source is supposed to be equivalent to shifting the pupil of the projection optical system by f''. Hence, if the light that has been emitted from one point f'' on the effective light source is diffracted by the mask pattern, the pupil of the projection optical system passes diffracted light within the range of $-1<f-f'\leq 1$, and shields diffracted light within the range of $|f-f'|>1$.

Assume that light that has been emitted from $f=f_4=0$ on the effective light source is diffracted by the mask pattern and focused through the pupil of the projection optical system. An amplitude $|\phi_1\rangle$ of diffracted light after passing through the pupil of the projection optical system is given by $$|\phi_1\rangle = (0011100)A|\phi\rangle \tag{7}$$

It is possible to calculate the light intensity on the wafer plane by squaring the absolute value of the amplitude of the diffracted light after passing through the pupil of the projection optical system. Hence, a light intensity distribution $I_1(x)$ the point source $f=f_4=0$ forms on the wafer plane is given by $$I_1(x) = \langle \phi_1 | \phi_1 \rangle \tag{8}$$

where $\langle\phi_1|$ is the transposed conjugate (a joint) matrix of $|\phi_1\rangle$.

Also, assume that light that has been emitted from $f=f_3$ on the effective light source is diffracted by the mask pattern and focused through the pupil of the projection optical system. An amplitude $|\phi_2\rangle$ of diffracted light after passing through the pupil of the projection optical system is given by $$|\phi_2\rangle = (0001110)A|\phi\rangle \tag{9}$$

A light intensity distribution $I_2(x)$ the point source $f=f_3$ forms on the wafer plane is given by $$I_2(x) = \langle \phi_2 | \phi_2 \rangle \tag{10}$$

Partially coherent illumination can be regarded as a gathering of incoherent point sources. Assume that two point sources exist on the effective light source, and their coordinates are defined by $f=0$ and $f=f_3$. Since the two point sources are incoherent, a light intensity distribution $I(x)$ they form on the wafer plane is given by $I_1(x)+I_2(x)$ (i.e., the sum of light intensities on the wafer plane).

A P operator $P_{1D}$ is defined by $$P_{1D} = \begin{pmatrix} 0011100 \\ 0001110 \end{pmatrix} \tag{11}$$

Each row of the P operator $P_{1D}$ of equation (11) is a vector obtained by shifting the pupil of the projection optical system in accordance with the position of the point source on the effective light source. More specifically, the pupil of the projection optical system is shifted by the difference between the central position of the pupil of the projection optical system and the position of each point source. Using the P operator $P_{1D}$, the light intensity distribution $I(x)$ formed on the wafer plane is given by $$I(x) = \langle \phi'|P_{1D}{}^+ P_{1D}|\phi'\rangle \tag{12}$$

where "+" represents the transposed conjugate matrix of a given matrix. It can be confirmed from equation (12) that the light intensity distribution $I(x)$ equals $I_1(x)+I_2(x)$. In other words, an aerial image that is a light intensity distribution formed on the wafer plane can easily be expressed using the P operator $P_{1D}$.

Equation (12) can be rewritten as $$I(x) = \langle \phi'|T_{1D}|\phi'\rangle \tag{13}$$

where $T_{1D}$ is a matrix defined by $$T_{1D} = P_{1D}{}^+ P_{1D} \tag{14}$$

The matrix $T_{1D}$ of equation (14) represents a TCC. Calculation of the P operator $P_{1D}$ requires only shifting the pupil of the projection optical system but neither multiplication nor addition. It is therefore possible to calculate the P operator $P_{1D}$ in a shorter time. Since the TCC can be calculated by multiplying the P operator $P_{1D}$ by its transposed conjugate matrix, use of the P operator also enables TCC calculation in a shorter time.

Note that the P operator $P_{1D}$ is not a square matrix including equal numbers of rows and columns. In this case, using singular value decomposition, the P operator $P_{1D}$ is rewritten as $$P_{1D} = WSV \qquad (15)$$

where S is a diagonal matrix, and W and V are unitary matrices. If the P operator $P_{1D}$ is a matrix including L rows and M columns, generally, W has L rows and L columns, S has L rows and M columns, and V has M rows and M columns. If $L \geq M$, W has L rows and M columns, S has M rows and M columns, and V has M rows and M columns. On the other hand, if L<M, the number of rows can be made larger than the number of columns using a transposed matrix. For this reason, S includes many unnecessary rows or columns in which all elements that do not contribute to succeeding calculations are 0. When these rows or columns are deleted (i.e., the matrix is compressed) to generate a square matrix including rows or columns equal in number to a smaller one of L and M, S can be changed to a diagonal matrix.

Equation (15) is substituted into equation (12). Using the property of singular value decomposition that $W^+W$ is a unit matrix, we obtain $$\begin{aligned}I(x) &= \langle \phi' | P_{1D}^+ P_{1D} | \phi' \rangle \\ &= \langle \phi' | V^+ S^+ W^+ WSV | \phi' \rangle \\ &= \langle \phi' | V^+ S^+ SV | \phi' \rangle \\ &= \sum_{j=1}^{L} s_j^2 \langle \phi' | V_j^+ V_j | \phi' \rangle \\ &= \sum_{j=1}^{L} s_j^2 \langle \Phi_j | \Phi_j \rangle \end{aligned} \qquad (16)$$

where $V_j$ is a matrix obtained by removing the jth row of the matrix V.

The SOCS which is a conventional method of partially coherent imaging calculation decomposes a TCC into eigenvalues and eigenfunctions, as described above. Since the TCC is a very large matrix, a long time and an enormous computer memory are necessary for TCC calculation. Additionally, a long time is required to decompose the eigenvalues and eigenfunctions.

In this embodiment, however, the P operator undergoes singular value decomposition. If the P operator is an L×M matrix, the TCC has M rows and M columns, as is apparent from equation (14). L is the number of point sources formed by pupil division. M is the number of divisions within a range twice the pupil, and is almost twice the number of pupil divisions, i.e., the number of divisions in the range of $-1 \leq f \leq 1$. Since the number of elements of the P operator is always smaller than that of the TCC, the time required for singular value decomposition can be short. In addition, P operator calculation requires no complex calculations such as multiplication and addition. This enables to calculate the P operator in a shorter time. In other words, use of the P operator allows to calculate eigenvalues and eigenfunctions by a smaller calculation amount and smaller computer memory as compared to the SOCS. It is consequently possible to calculate an aerial image that is a light intensity distribution formed on the wafer plane in a shorter time. Use of equation (14) also enables to calculate the TCC in a shorter time.

A case will be examined in which the plurality of point sources of the effective light source are divided into a plurality of point source sets (that is, the effective light source is divided into a plurality of areas).

Using a diffracted light shift matrix $P^1_{iD} = (0\ 0\ 1\ 1\ 1\ 0\ 0)$ of equation (7) and a diffracted light shift matrix $P^2_{iD} = (0\ 0\ 0\ 1\ 1\ 1\ 0)$ of equation (9), equation (12) can be rewritten as $$\begin{aligned}I(x) &= \langle \phi' | P_{1D}^+ P_{1D} | \phi' \rangle \\ &= \langle \phi' | P_{1D}^{1+} P_{1D}^1 | \phi' \rangle + \langle \phi' | P_{1D}^{2+} P_{1D}^2 | \phi' \rangle \\ &= I_1(x) + I_2(x) \end{aligned} \qquad (17)$$

Equation (17) indicates that a result obtained by calculating a light intensity distribution using a P operator defined in the whole effective light source matches a result obtained by calculating light intensity distributions using P operators respectively defined in a plurality of point source sets (a plurality of areas) and compositing them. In this embodiment, the effective light source including two point sources is divided into point source sets each including one point source. Needless to say, the division may be done to form each point source set including a plurality of point sources.

Calculation of a one-dimensional aerial image (light intensity distribution) has been described above. Calculation of a two-dimensional aerial image (light intensity distribution) will be described below.

Let $(f_i, g_j)$ be coordinates on the discretized pupil plane of the projection optical system. In this example, i and j range from 1 to M. A vector $|\phi'_{2D}\rangle$ of a diffracted light distribution is given one-dimensionally by $$|\phi'_{2D}\rangle = \begin{pmatrix} a(f_1, g_1)e^{-i2\pi(f_1 x + g_1 y)} \\ a(f_2, g_1)e^{-i2\pi(f_2 x + g_1 y)} \\ \vdots \\ a(f_M, g_1)e^{-i2\pi(f_M x + g_1 y)} \\ a(f_1, g_2)e^{-i2\pi(f_2 x + g_1 y)} \\ \vdots \\ a(f_M, g_N)e^{-i2\pi(f_M x + g_M y)} \end{pmatrix} \qquad (18)$$

To specifically express $|\phi'_{2D}\rangle$, floor represents that fractions below the decimal point are dropped. When $j = \text{floor}[(n-1) \div M] + 1$, and $i = n - (j-1) \times M$, the nth row of $|\phi'_{2D}\rangle$ is $a(f_i, g_i) \exp[-i2\pi(f_i x + g_i y)]$. A two-dimensional complete orthogonal system is thus expressed.

When the coordinates of the first point source on the effective light source are $(f_1, g_1)$, causing light to emit from the first point source is supposed to be equivalent to shifting the pupil function P(f,g) representing the pupil of the projection optical system by $(f_1, g_1)$. For this reason, the pupil function $P_1(f,g)$ that acts on the diffracted light is represented by $P(f+f_1, g+g_1)$. The elements of the pupil function $P_1(f,g)$ are one-dimensionally arranged.

$$P_1 = (P_1(f_1, g_1) P_1(f_2, g_1) \ldots P_1(f_M, g_1) P_1(f_1, g_2) \ldots P_1(f_M, g_M)) \qquad (19)$$

This expresses the pupil function $P_1$ by a one-dimensional vector.

To specifically express $P_1$, floor represents that fractions below the decimal point are dropped. When $j = \text{floor}[(n-1) \div M] + 1$, and $i = n - (j-1) \times M$, the nth row of $P_1$ is $P_1(f_i, g_j)$. A two-dimensional complete orthogonal system is thus expressed.

When the coordinates of the second point source on the effective light source are $(f_2, g_2)$, a pupil function $P_2(f_2, g_2)$ that acts on light emitted from the second point source is expressed as $P(f+f_2, g+g_2)$ by shifting $P(f,g)$ by $(f_2, g_2)$. Like the pupil function $P_1$, the pupil function $P_2$ can be expressed by a one-dimensional vector given by $$P_2 = (P_2(f_1, g_1) P_2(f_2, g_1) \ldots P_2(f_M, g_1) P_2(f_1, g_2) \ldots P_2(f_M, g_M)) \quad (20)$$

When N point sources exist on the effective light source, a two-dimensional P operator can be defined by $$P_{2D} = \begin{pmatrix} P_1 \\ P_2 \\ \vdots \\ P_N \end{pmatrix} \quad (21)$$

Using $|\phi'_{2D}\rangle$ and $P_{2D}$, the two-dimensional light intensity distribution $I(x,y)$ formed on the wafer plane can be calculated by $$I(x,y) = \langle \phi'_{2D} | P_{2D}^+ P_{2D} | \phi'_{2D} \rangle \quad (22)$$

Singular value decomposition of $P_{2D}$ of equation (22) yields $$I(x, y) = \langle \phi'_{2D} | P_{2D}^+ P_{2D} | \phi'_{2D} \rangle \quad (23)$$
$$= \langle \phi'_{2D} | V^+ S^+ W^+ W S V | \phi'_{2D} \rangle$$
$$= \langle \phi'_{2D} | V^+ S^+ S V | \phi'_{2D} \rangle$$
$$= \sum_{j=1}^{N} s_j^2 \langle \phi'_{2D} | V_j^+ V_j | \phi'_{2D} \rangle$$

As described above, even when calculating a two-dimensional aerial image (light intensity distribution), the number of elements of the P operator is smaller than that of a TCC, and the P operator calculation requires no complex calculations. It is consequently possible to calculate an aerial image that is a light intensity distribution formed on the wafer plane in a shorter time.

A case will be examined in which an effective light source including N point sources is divided into a point source set X1 including N1 point sources and a point source set X2 including (N−N1) point sources. Pi (i=1 to N) of equation (21) is divided by i=1 to N1, and j=N1+1 to N. A two-dimensional P operator is defined for each point source set by $$P_{2D}^1 = \begin{pmatrix} P_1 \\ P_2 \\ \vdots \\ P_{N1} \end{pmatrix} = W_1 S_1 V_1 \quad (24)$$

$$P_{2D}^2 = \begin{pmatrix} P_{N1+1} \\ P_{N1+2} \\ \vdots \\ P_N \end{pmatrix} = W_2 S_2 V_2 \quad (25)$$

Using equations (24) and (25), equation (23) can be rewritten as $$I(x, y) = \langle \phi'_{2D} | P_{2D}^+ P_{2D} | \phi'_{2D} \rangle \quad (26)$$
$$= \langle \phi'_{2D} | P_{2D}^{1+} P_{2D}^1 | \phi'_{2D} \rangle + \langle \phi'_{2D} | P_{2D}^{2+} P_{2D}^2 | \phi'_{2D} \rangle$$
$$= \langle \phi'_{2D} | V_1^+ S_1^+ W_1^+ W_1 S_1 V_1 | \phi'_{2D} \rangle +$$
$$\langle \phi'_{2D} | V_2^+ S_2^+ W_2^+ W_2 S_2 V_2 | \phi'_{2D} \rangle$$
$$= \langle \phi'_{2D} | V_1^+ S_1^+ S_1 V_1 | \phi'_{2D} \rangle + \langle \phi'_{2D} | V_2^+ S_2^+ S_2 V_2 | \phi'_{2D} \rangle$$
$$= \sum_{j=1}^{N1} s_{1j}^2 \langle \phi'_{2D} | V_{1j}^+ V_{1j} | \phi'_{2D} \rangle + \sum_{j=1}^{N-N1} s_{2j}^2 \langle \phi'_{2D} | V_{2j}^+ V_{2j} | \phi'_{2D} \rangle$$

Equation (26) is two-dimensional expression of equation (17) and demonstrates that even when the effective light source is divided into a plurality of point source sets (a plurality of areas), singular value decomposition of each P operator suffices. As is apparent from equation (26), the same light intensity distribution is obtained even by dividing the effective light source into a plurality of point source sets (a plurality of areas).

However, it is not self-evident that dividing the effective light source into a plurality of point source sets (a plurality of areas) should shorten the calculation time. When the effective light source is divided into a plurality of point source sets, the number of rows of each P operator decreases. For example, the P operator for the entire effective light source in equation (21) is an N×$M^2$ matrix. On the other hand, the P operators indicated by equations (24) and (25) are an N1×$M^2$ matrix and an (N−N1)×$M^2$ matrix, respectively. That is, the matrix sizes are smaller. This shortens the calculation time of singular value decomposition. The present inventor did singular value decomposition of an L×L matrix by MATLAB® and found that the calculation time increases by about 2.7th power of L. For this reason, dividing the effective light source into a plurality of point source sets (a plurality of areas) contributes to calculation time shortening when, for example, the number of pupil divisions is increased for higher calculation accuracy.

Additionally, dividing the effective light source into a plurality of point source sets (a plurality of areas) enables to more effectively compress the pupil discrete matrix (P operator). Compression of the pupil discrete matrix indicates deleting rows or columns in which all elements unnecessary for singular value decomposition are 0. For example, compression of equation (11) yields $$P_{1D}^c = \begin{pmatrix} 1110 \\ 0111 \end{pmatrix} \quad (27)$$

Figure 3B:
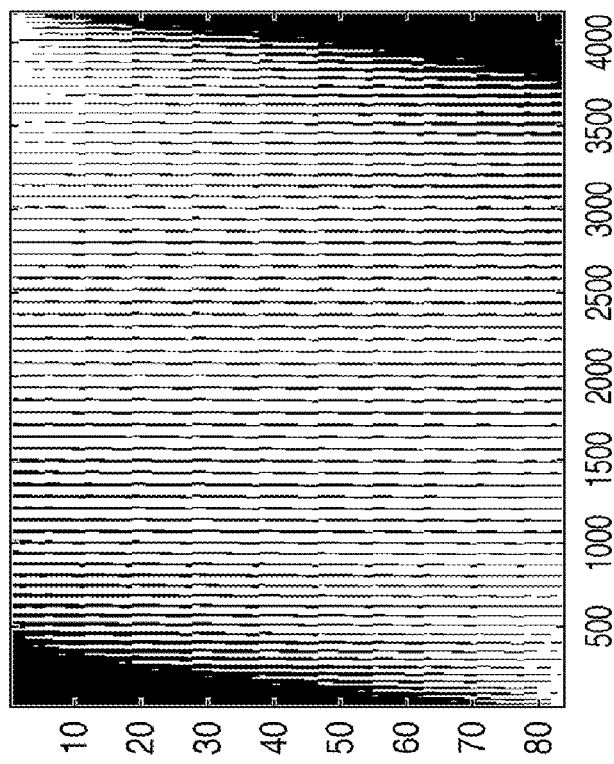
FIGS. 3A and 3B are views for explaining the effect of pupil discrete matrix (P operator) compression.
Figure 3A:
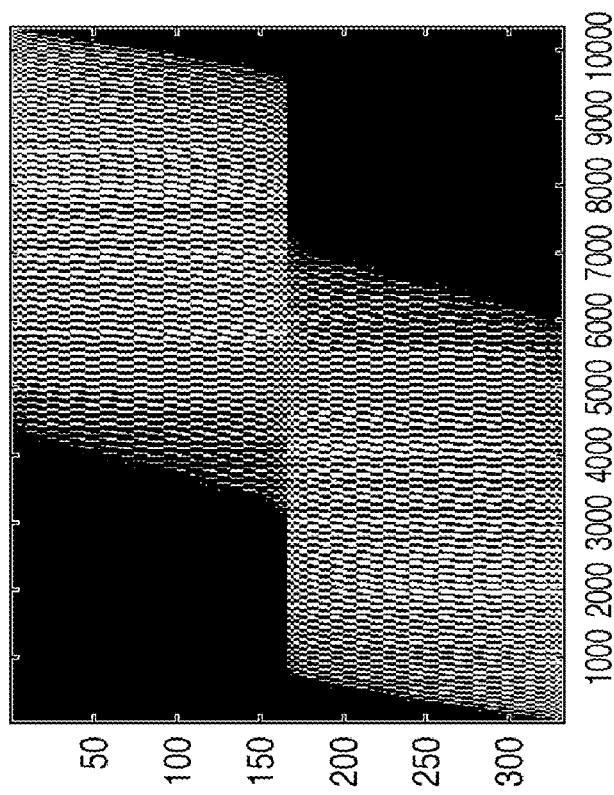

FIGS. 3A and 3B are views for explaining the effect of pupil discrete matrix (P operator) compression. FIG. 3A shows a compressed P operator for an effective light source having a quadrupole shape. FIG. 3B shows a compressed P operator for one of the effective light source (one of four divided areas of the effective light source having the quadrupole shape). In FIGS. 3A and 3B, black parts indicate that matrix elements are 0, whereas white parts indicate that matrix elements are 1.

The P operator shown in FIG. 3A is a matrix having 332 rows and 10,345 columns. The P operator shown in FIG. 3B is a matrix having 83 rows and 4,183 columns. Referring to FIGS. 3A and 3B, when the effective light source is divided into four areas, the number of rows of the P operator simply becomes ¼ while the number of columns of the P operator decreases to ½ or less. The P operator shown in FIG. 3A includes many parts with elements "0". However, the compression cannot effectively function because of the elements of diffracted light shift matrices of other point sources. On the other hand, the P operator shown in FIG. 3B largely decreases the number of columns because the compression effectively functions. It is therefore possible to greatly shorten the calculation time of singular value decomposition.

Without dividing the effective light source, the number of elements expressible by the product of the number of rows and the number of columns is 3,434,540. If a square matrix has 3,434,540 elements, the number of rows (the number of columns) is approximately 1,853. When the effective light source is divided, the number of elements expressible by the product of the number of rows and the number of columns is 347,189. If a square matrix has 347,189 elements, the number of rows is approximately 589. The 2.7th powers of these values are 665,677,123 and 30,151,665. The quadruple of the latter is only about 0.18 times of the former. This difference accounts for the difference in the calculation time.

In this embodiment, a non-square matrix is assumed to be a square matrix. However, it is not difficult to create the database or empirical formula of the calculation time of singular value decomposition for a non-square matrix.

The calculation of a two-dimensional aerial image (light intensity distribution) will be described more commonly. A set of two-dimensional light diffracted by the mask pattern is given by $$\Psi_{2D} = \begin{pmatrix} a(f_1, g_1)e^{-i2\pi(f_1 x+g_1 y)} & a(f_2, g_1)e^{-i2\pi(f_2 x+g_1 y)} & \cdots & a(f_M, g_1)e^{-i2\pi(f_M x+g_1 y)} \\ a(f_1, g_2)e^{-i2\pi(f_1 x+g_2 y)} & \ddots & & \vdots \\ \vdots & & & \\ a(f_1, g_M)e^{-i2\pi(f_1 x+g_M y)} & \cdots & & a(f_M, g_M)e^{-i2\pi(f_M x+g_M y)} \end{pmatrix} \quad (28)$$

where $\Psi_{2D}$ is an M×M matrix including $M^2$ elements. An operator (stacking operator) Y for converting (i.e., rearranging) an M×M matrix into a 1×$M^2$ matrix based on a predetermined rule is introduced. When the stacking operator Y is introduced, the vector $|\phi'_{2D}\rangle$ of the two-dimensional diffracted light distribution is given by $$|\phi'_{2D}\rangle = Y[\Psi_{2D}]^T \quad (29)$$

When the coordinates of the first point source on the effective light source are $(f_1, g_1)$, causing light to emit from the first point source is supposed to be equivalent to shifting the pupil of the projection optical system. For this reason, the pupil function $P_1(f,g)$ that acts on the diffracted light is represented by $P(f+f_1, g+g_1)$. Hence, the pupil function $P_1(f,g)$ is given by $$P'_1 = \begin{pmatrix} P_1(f_1, g_1) & P_1(f_2, g_1) & \cdots & P_1(f_M, g_1) \\ P_1(f_1, g_2) & \ddots & & \vdots \\ \vdots & & & \\ P_1(f_1, g_M) & \cdots & & P_1(f_M, g_M) \end{pmatrix} \quad (30)$$

Similarly, when the coordinates of the second point source on the effective light source are $(f_2, g_2)$, the pupil function $P_2(f,g)$ that acts on the light emitted from the second point source is represented by $P(f+f_2, g+g_2)$. Hence, like the pupil function $P_1(f,g)$, the pupil function $P_2(f,g)$ is given by $$P'_2 = \begin{pmatrix} P_2(f_1, g_1) & P_2(f_2, g_1) & \cdots & P_2(f_M, g_1) \\ P_2(f_1, g_2) & \ddots & & \vdots \\ \vdots & & & \\ P_2(f_1, g_M) & \cdots & & P_2(f_M, g_M) \end{pmatrix} \quad (31)$$

When N point sources exist on the effective light source, the two-dimensional P operator is given, using the stacking operator Y, by $$P_{2D} = \begin{pmatrix} Y[P'_1] \\ Y[P'_2] \\ \vdots \\ Y[P'_N] \end{pmatrix} \quad (32)$$

To calculate an aerial image that is a light intensity distribution formed on the wafer plane based on equations (29) and (32), equation (22) or (23) is used.

A TCC can be calculated by $$T_{2D} = P_{2D}^+ P_{2D} \quad (33)$$

The P operator that shifts the pupil of the projection optical system to form point sources in the row direction, as indicated by equation (21) or (32), has been described above. However, a P operator that shifts the pupil of the projection optical system to form point sources in the column direction makes no difference in essence. The description of the orthogonal function system need only match even when the P operator is given by $$P_{2D} = (Y[P'_1]^T Y[P'_2]^T \ldots Y[P'_N]^T \quad (34)$$

When calculating a two-dimensional aerial image (light intensity distribution), the P operator can be expressed by equation (32). Letting L be the number of pupil divisions, and N be the number of point sources, the P operator is an N×(2L)² matrix. Since the rows of the P operator are independent, the rank of the P operator is N. Hence, when the P operator undergoes singular value decomposition, N eigenvalues and eigenfunctions are calculated. To calculate a perfect aerial image, N eigenvalues and eigenfunctions are necessary. Actually, it is unnecessary to use N eigenvalues and eigenfunctions. Using only an eigenvalue with a large absolute value suffices.

The squares of the eigenvalues are rearranged in descending order and numbered k (k=1, 2, . . . , N). Let E be the square sum of all eigenvalues, and Ei be the square sum of first to ith eigenvalues. It is possible to calculate a light intensity distribution at sufficient accuracy by considering eigenvalues that yield Ei/E with a predetermined value (for example, 0.98 or more). Additionally, when the number k is reduced from N, the number of additions in equation (23) can be reduced. Since calculating $V_j|\phi'_{2D}\rangle$ corresponds to two-dimensional discrete Fourier transform, reduction of the number k, which reduces the calculation rank, is effective in shortening the calculation time. Note that when the effective light source is divided into a plurality of point source sets (a plurality of areas), Ei/E can be given to each point source set.

As described above, in the partially coherent imaging calculation method using a P operator, singular value decomposition of the P operator and discrete Fourier transform for eigenvectors determine the calculation time.

Figure 4:
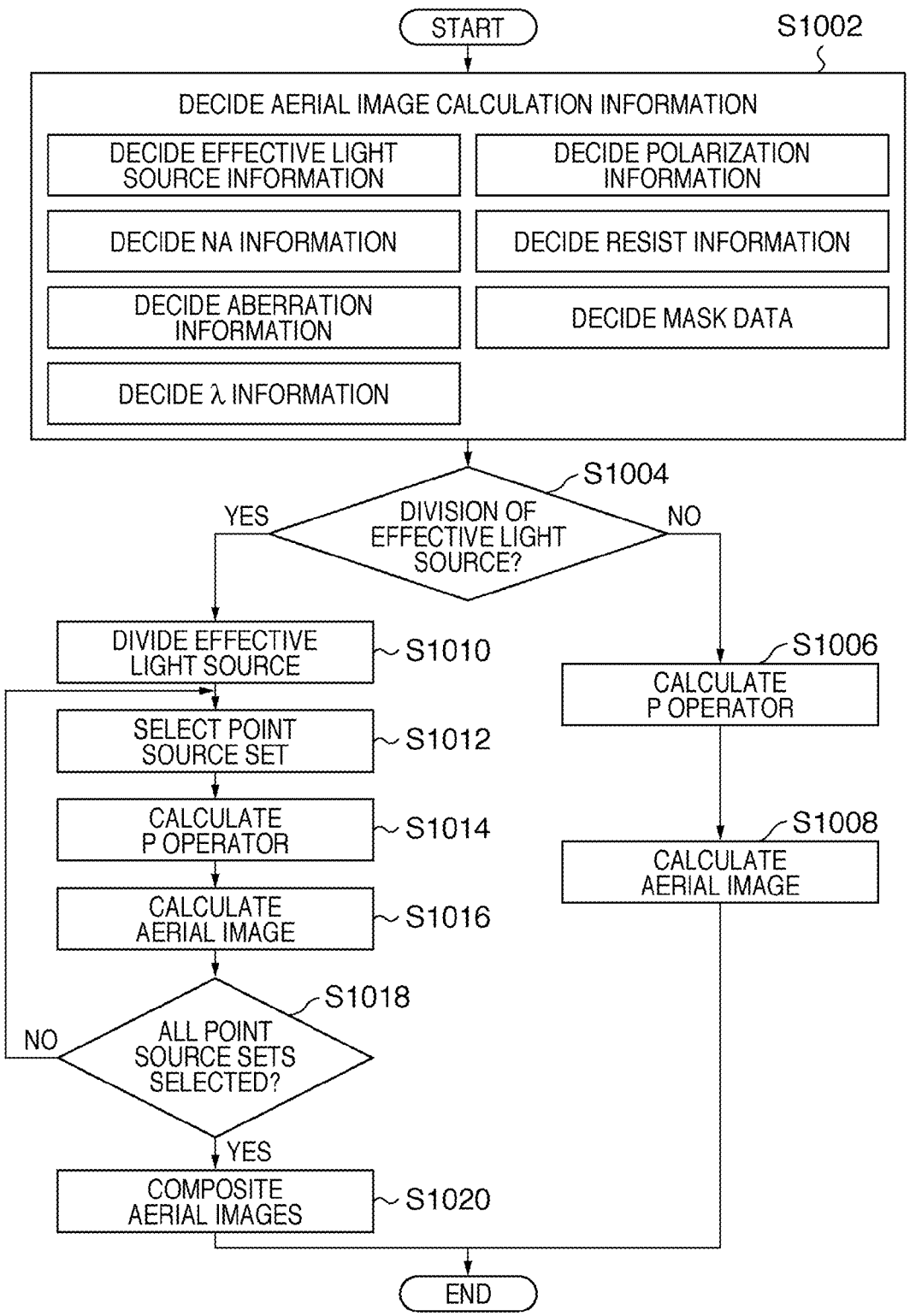
FIG. 4 is a flowchart for explaining aerial image calculation processing by an aerial image calculation program in the processing apparatus shown in FIG. 1.

FIG. 4 is a flowchart for explaining the calculation processing of the aerial image 409 by the aerial image calculation program 420. Note that the aerial image calculation program 420 is installed from the storage medium 70 connected to the medium interface 60, and stored in the storage unit 40 via the control unit 20. The aerial image calculation program 420 is activated in accordance with a user's activation instruction input from the input unit 50, and executed by the control unit 20.

In step S1002, the control unit 20 decides aerial image calculation information including the effective light source information 402, NA information 403, λ information 404, aberration information 405, polarization information 406, resist information 407, and mask data 410. More specifically, the user inputs (selects), via the input unit 50, effective light source information "quadrupole illumination", NA information "0.73", λ information "248 nm", aberration information "no aberration", polarization information "no polarization", resist information "not considered", and mask data "contact hole". In accordance with the aerial image calculation program 420, the control unit 20 displays, on the display unit 30, the aerial image calculation information input (selected) by the user, and decides the aerial image calculation information. In this embodiment, an example will be described in which the aerial image calculation information is stored in the storage unit 40 in advance, and the user inputs (selects) the aerial image calculation information stored in the storage unit 40. However, the user can also input aerial image calculation information that is not stored in the storage unit 40.

In step S1004, the control unit 20 determines, based on the effective light source information 402 decided in step S1002, whether to divide the effective light source into a plurality of point source sets (a plurality of areas). The criterion by which to determine whether to divide the effective light source into a plurality of point source sets (a plurality of areas) is, for example, whether the time to calculate the aerial image 409 shortens. In this case, the aerial image calculation program 420 includes a database or empirical formula of the calculation time (the time necessary for calculating the aerial image 409) corresponding to the aerial image calculation information. The effective light source division determination in step S1004 will be described later in detail.

Upon determining in step S1004 not to divide the effective light source into a plurality of point source sets (a plurality of areas), the control unit 20 calculates the P operator 408 in step S1006, regarding the effective light source as one point source set. More specifically, the control unit 20 receives, from the storage unit 40, the aerial image calculation information input (selected) by the user, and calculates the P operator 408 based on the aerial image calculation information using, for example, equation (21) or (32). The control unit 20 also stores the calculated P operator 408 in the storage unit 40.

In step S1008, the control unit 20 calculates the aerial image 409. More specifically, the control unit 20 calculates the aerial image 409 using, for example, equation (16) or (23) based on the aerial image calculation information input (selected) by the user and the P operator 408 calculated in step S1006. The control unit 20 also displays the aerial image 409 on the display unit 30 and stores it in the storage unit 40.

On the other hand, upon determining in step S1004 to divide the effective light source into a plurality of point source sets (a plurality of areas), the control unit 20 divides the effective light source into a plurality of point source sets (a plurality of areas) in step S1010. More specifically, the control unit 20 divides the effective light source into a plurality of point source sets (a plurality of areas) in accordance with a division model selected in step S1004, as will be described later.

In step S1012, the control unit 20 selects one point source set (one area) of the plurality of point source sets (the plurality of areas) divided in step S1010. This point source set represents not the effective light source corresponding to the effective light source information 402 but an effective light source corresponding to certain effective light source information.

In step S1014, the control unit 20 calculates the P operator 408, as in step S1006, for the point source set selected in step S1012.

In step S1016, the control unit 20 calculates the aerial image 409, as in step S1008, for the point source set selected in step S1012. At this time, the control unit 20 performs singular value decomposition of the P operator 408 (i.e., decomposes the P operator into eigenvalues and eigenfunctions) (first calculation step), and calculates the aerial image 409 (second calculation step).

In step S1018, the control unit 20 determines whether all point source sets divided in step S1010 have been selected.

If it is determined that not all point source sets divided in step S1010 have been selected, the process returns to step S1012 to repeat the process from step S1012. If it is determined that all point source sets divided in step S1010 have been selected, the process advances to step S1020.

In step S1020, the control unit 20 composites the plurality of aerial images 409 (i.e., the aerial images 409 formed by the plurality of point source sets) calculated by repeating steps S1012 to S1018. As indicated by equation (2), the sum of the aerial images formed by the point source sets corresponds to the aerial image of the entire effective light source. For this reason, the aerial image of the entire effective light source is obtained by compositing (totaling) the aerial images calculated from the plurality of point source sets (the plurality of areas), as a matter of course.

Effective light source division determination in step S1004 will be explained in detail with reference to FIG. 5.

In step S2002, the control unit 20 divides the effective light source into point sources and acquires a total number Np of point sources and the position information (coordinates) of each point source.

In step S2004, the control unit 20 determines whether the total number Np of point sources acquired in step S2002 falls within a designated range (range designated in advance). The designated range is the range of the number of point sources which guarantees the calculation time of the aerial image 409 to shorten by dividing the effective light source into a plurality of point source sets (a plurality of areas). In this embodiment, if the total number Np of point sources is large to some extent, the calculation time of the aerial image 409 can effectively shorten. Hence, the designated range is set as a designated number N or more. However, the designated range can also be set as a range defined by upper and lower limit values.

Upon determining that the total number Np of point sources acquired in step S2002 does not fall within the designated range (not the designated number N or more in this embodiment), the process advances to step S1006 in FIG. 4 to calculate the aerial image 409 without dividing the effective light source. On the other hand, upon determining that the total number Np of point sources acquired in step S2002 falls within the designated range (the designated number N or more in this embodiment), the process advances to step S2006. Note that the designated number N may be set to 1. In this case, the effective light source is always divided.

In step S2006, the control unit 20 determines whether to use a preset division model to divide the effective light source into a plurality of point source sets (a plurality of areas). Note that the division model is a model representing how to divide the effective light source (effective light source division method), and includes, for example, a division model for dividing the effective light source into rectangles. When two-dimensional coordinates are set on the effective light source, the division models also include a division model for dividing the effective light source into the quadrants of the two-dimensional coordinates, a division model for dividing the effective light source in the angle directions of the two-dimensional coordinates, and a division model for dividing the effective light source in the angle directions and radial directions of the two-dimensional coordinates.

Upon determining to use a division model, the control unit 20 selects one of the plurality of different division models described above in step S2008 based on the position information of each point source acquired in step S2002. Alternatively, the control unit 20 may calculate, for each of the plurality of division models, the time required for processing associated with calculation of the aerial image 409, and select a division model for which the time is shorter than a predetermined time. When a division model is selected, the process advances to step S1010 in FIG. 4.

Upon determining not to use a division model, the control unit 20 executes processing of dividing the effective light source without using a division model from step S2010. In this embodiment, the effective light source is divided to minimize the calculation time of the aerial image 409. However, the effective light source may be divided to minimize the memory capacity required by the computer.

In step S2010, the control unit 20 sets a minimum calculation time tmin. A very large value such as 1.0E30 (sec) is set as the minimum calculation time tmin.

In step S2012, the control unit 20 temporarily sets the effective light source division method and the number of divisions.

In step S2014, assuming that the effective light source is divided into a plurality of point source sets (a plurality of areas) in accordance with the effective light source division method and the number of divisions temporarily set in step S1012, the control unit 20 determines, for each point source set, whether the number of point sources falls within a designated range. The designated range can be set either as a designated number N' or as a range defined by upper and lower limit values.

Upon determining for each point source set that the number of point sources falls within the designated range, the process advances to step S2016.

Upon determining for each point source set that the number of point sources does not fall within the designated range, the process advances to step S2022.

In step S2016, the control unit 20 estimates a calculation time tp of the aerial image 409. More specifically, the calculation time tp can be estimated by obtaining the time necessary for SVD calculations of all point source sets using the number of matrix elements from the database or empirical formula. The calculation time per FFT (Fast Fourier Transform) necessary for calculation of the aerial image 409 and the necessary number of times of FFT can also be known. It is therefore possible to estimate the calculation time tp based on the calculation time per FFT and the necessary number of times of FFT.

In step S2018, the control unit 20 determines whether the calculation time tp estimated in step S2016 is smaller than the minimum calculation time tmin set in step S2010.

Upon determining that the calculation time tp is smaller than the minimum calculation time tmin (t<tmin), the process advances to step S2020. On the other hand, upon determining that the calculation time tp is not smaller than the minimum calculation time tmin (t≧tmin), the process returns to step S2012 to temporarily set the effective light source division method and the number of divisions again.

In step S2020, the control unit 20 stores, in the storage unit 40, the effective light source division method and the number of divisions temporarily set in step S2012 and the calculation time tp estimated in step S2016.

In step S2022, the control unit 20 determines whether to repeat steps S2012 to S2020. In other words, the control unit 20 determines whether to further change the division method and the number of divisions and estimate the calculation time tp.

Upon determining to repeat steps S2012 to S2020, the process returns to step S2012. Upon determining not to repeat steps S2012 to S2020, the process advances to step S2024.

In step S2024, the control unit 20 selects the effective light source division method and the number of divisions stored in step S2020 as a division model and the process advances to step S1010 in FIG. 4.

In step S2012, an arbitrary division method and an arbitrary number of divisions can be set temporarily. However, it does not mean that a complex division method and a large number of divisions are preferable, as will be described later. For example, the division method and the number of divisions may temporarily be set by deforming the above-described division model (e.g., a division model for dividing the effective light source into rectangles).

As described above, in the calculation processing of the aerial image 409 by the aerial image calculation program 420, the aerial image 409 can be calculated using the P operator 408. In other words, in the calculation processing of the aerial image 409 by the aerial image calculation program 420, the aerial image 409 can be calculated without calculating a TCC that is necessary in the SOCS. It is therefore possible to generally simplify the calculation and shorten the time necessary for calculating the aerial image 409. In calculating the aerial image 409 using the P operator, it is also possible to further shorten the calculation time by dividing the effective light source into a plurality of point source sets (a plurality of areas) and compositing the aerial images 409 calculated for the respective point source sets.

The result of calculation of the aerial image 409 by the aerial image calculation program 420 is analyzed as needed. The aerial image analysis includes, for example, visual confirmation of the aerial image, slope of the aerial image (NILS: Normalized Intensity Log Slope), contrast, CD variation by defocus (DOF: Depth Of Focus), and confirmation of matching with the pattern data 401. The manner the aerial image 409 acts on a resist can also be confirmed. Note that any method known by those skilled in the art is applicable to the aerial image analysis.

The calculation processing of the aerial image 409 by the aerial image calculation program 420 is applicable to various model-based RETs. For example, applying the calculation processing of the aerial image 409 by the aerial image calculation program 420 to optical proximity effect correction makes it possible to quickly generate mask data that allows accurate formation of a fine pattern (i.e., allows to create a mask in a short time). Note that the optical proximity effect correction is generally called OPC (Optical Proximity Correction).

In the following embodiments, the effects of the calculation processing of the aerial image 409 by the aerial image calculation program 420 and its application to an exposure apparatus will be described in detail.

In a first embodiment, Xeon® 32 bit was used as a CPU included in a control unit 20 of a processing apparatus 1, and a memory of about 2 Gbytes was used as a storage unit 40. An aerial image calculation program 420 was created using MATLAB®. The time in calculating an aerial image 409 while dividing the effective light source was compared with the time in calculating the aerial image 409 without dividing the effective light source.

Figure 6A:
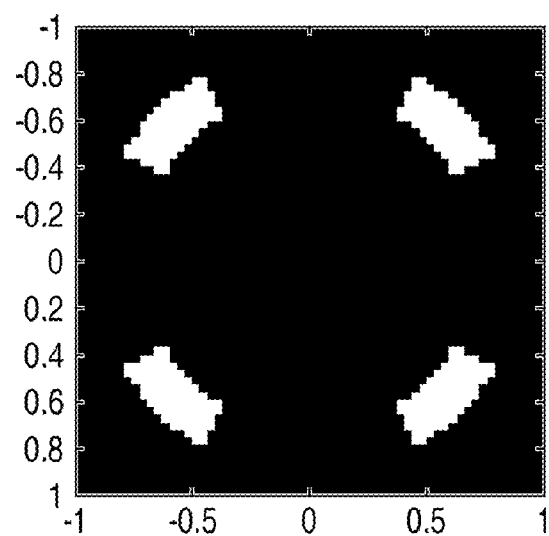
FIG. 6A is a view showing an effective light source used in the first embodiment.
Figure 6B:
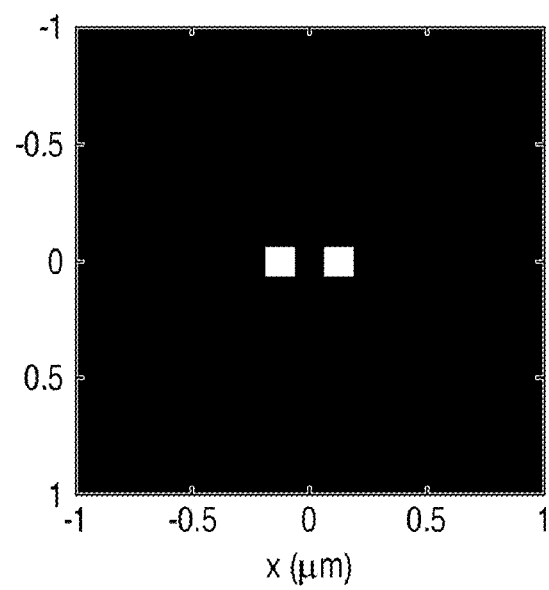
FIG. 6B is a view showing mask data used in the first embodiment.

In the first embodiment, assume that the NA of the projection optical system of the exposure apparatus is 0.73 (corresponding to NA information 403), and the wavelength of exposure light is 248 nm (corresponding to λ information 404). The projection optical system has no aberration (corresponding to aberration information 405), the illumination light has no polarization (corresponding to polarization information 406), and a resist to be applied to a wafer is not taken into consideration (corresponding to resist information 407). Quadrupole illumination as shown in FIG. 6A is used as the effective light source. Pattern data (target pattern) 401 includes two contact hole patterns. The side of each contact hole pattern is 120 nm. The centers of the contact hole patterns are at (−120 nm, 0 nm) and (120 nm, 0 nm). Hence, mask data 410 shown as in FIG. 6B is generated. When the number of divisions of the pupil of the projection optical system is 64, the total number of point sources of the effective light source shown in FIG. 6A is 332. The number of divisions when executing Fourier transform is set at 256. Ei/E=1.0. That is, the aerial image 409 is calculated using all eigenvalues.

Figure 7:
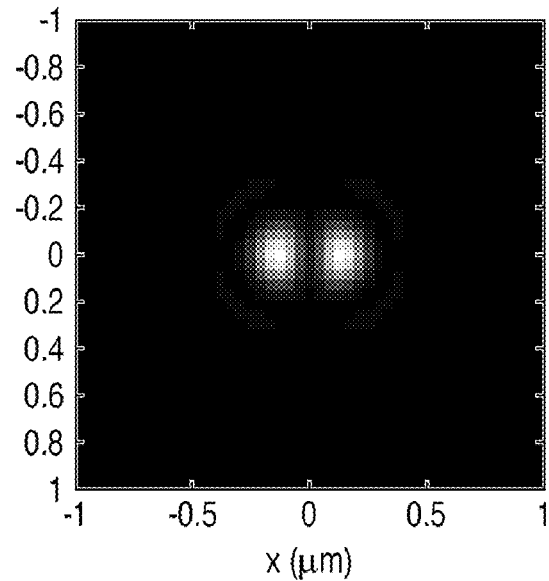
FIG. 7 is a view showing an aerial image calculated without dividing the effective light source shown in FIG. 6A.
Figure 8A:
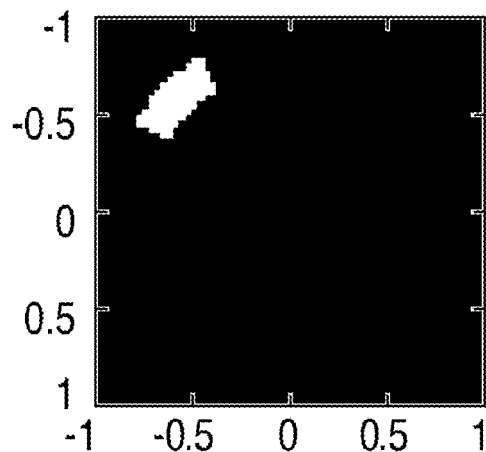
FIGS. 8A to 8D are views showing four point source sets (four areas) obtained by dividing the effective light source shown in FIG. 6A.
Figure 8B:
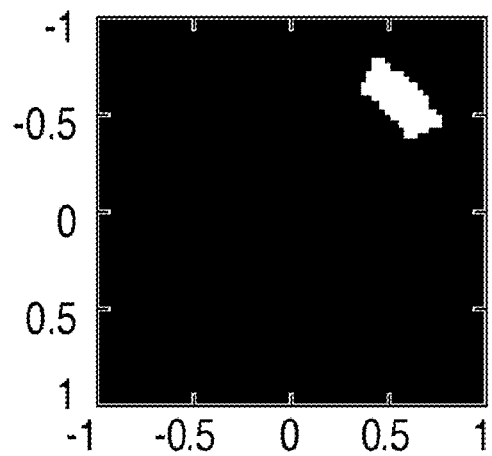
Figure 8C:
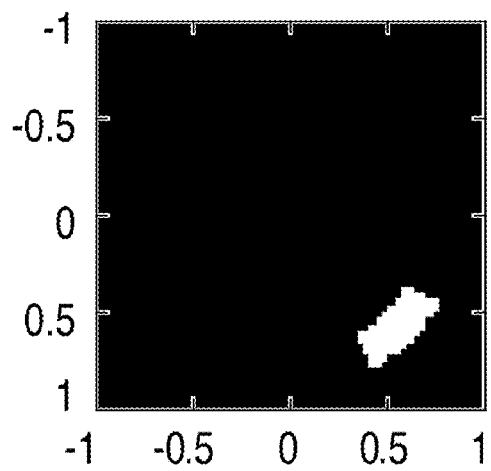
Figure 8D:
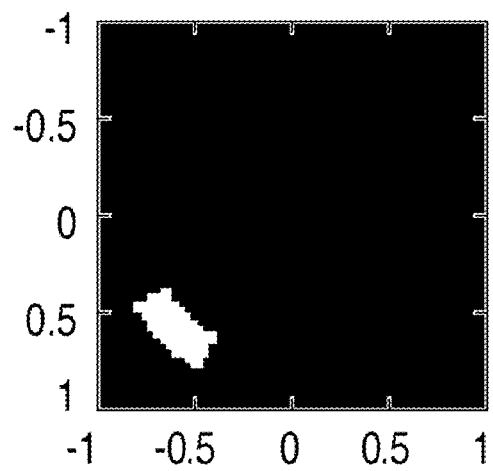

First, the aerial image 409 was calculated without dividing the effective light source shown in FIG. 6A. More specifically, the control unit 20 calculates a P operator 408 based on the above-described aerial image calculation information. The time required for calculation of the P operator 408 was 0.1 sec or less. The control unit 20 also performs singular value decomposition of the P operator 408 (i.e., divides the P operator 408 into eigenvalues and eigenfunctions). The time required for singular value decomposition of the P operator 408 was 9.2 sec. Additionally, a perfect aerial image was calculated by adding all eigenfunctions. Then, the aerial image 409 as shown in FIG. 7 was obtained. The time required for calculation of the aerial image 409 was about 28 sec. Note that the aerial image 409 shown in FIG. 7 is normalized to set 1 as the maximum value.

Next, the aerial image 409 was calculated while dividing the effective light source shown in FIG. 6A. More specifically, the control unit 20 divides the effective light source shown in FIG. 6A into four point source sets (four areas), as shown in FIGS. 8A to 8D. In the first embodiment, the effective light source is supposed to have been divided into four patterns of two-dimensional coordinates (x,y), in which both x and y values have positive values or negative values, or the two values have opposite signs. Alternatively, regarding the two-dimensional coordinates as polar coordinates (R,θ), 360° may be divided into four parts. The control unit 20 calculates the P operator 408 for each of the point source sets, and performs singular value decomposition of the P operator 408. The time required for singular value decomposition of the P operator 408 for one point source set was 0.56 to 0.57 sec. In total, the time was only 2.26 sec. Hence, the time required for singular value decomposition of the P operator 408 shortens largely (to about ¼) as compared to the case without effective light source division.

Figure 9:
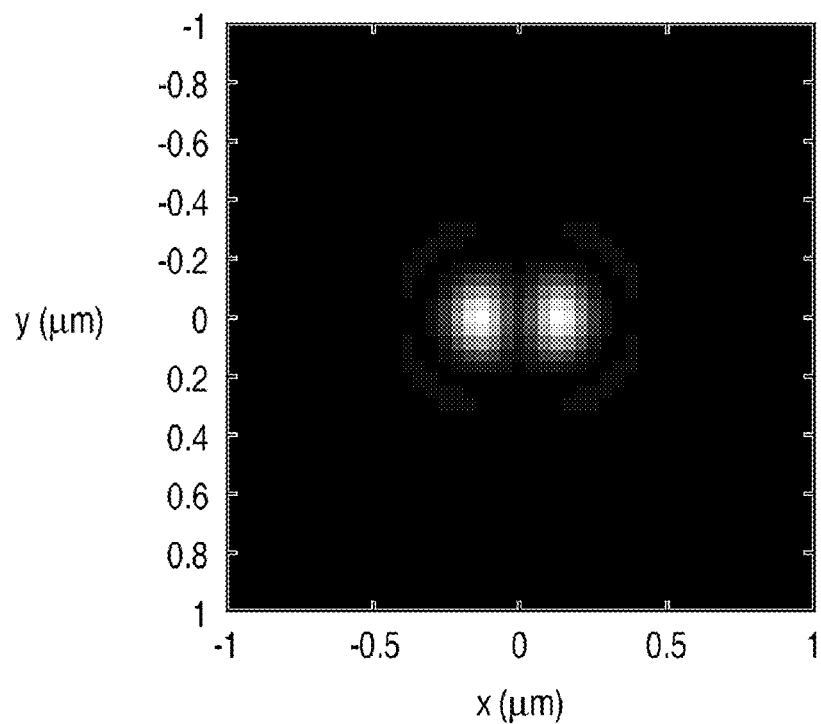
FIG. 9 is a view showing an aerial image calculated by dividing the effective light source shown in FIG. 6A.

When the aerial images calculated from the respective point source sets were composited, the aerial image 409 as shown in FIG. 9 was obtained. The time required for calculation of the aerial image 409 was about 21 sec. The time required for calculation of the aerial image 409 shortens by about 7 sec, as compared to the case without effective light source division. The time difference almost matches the time difference for singular value decomposition. Note that the aerial image 409 shown in FIG. 7 and that shown in FIG. 9 match on the order of $1.0 \times 10^{-15}$.

As described above, the effective light source is divided into a plurality of point source sets (a plurality of areas), and aerial images calculated for the respective point source sets are composited. This effectively shortens the time required for singular value decomposition of the P operator and the time required for calculation of the aerial image for the entire effective light source.

In a second embodiment, Xeon® 32 bit was used as a CPU included in a control unit 20 of a processing apparatus 1, and a memory of about 2 Gbytes was used as a storage unit 40. An aerial image calculation program 420 was created using MATLAB®. The time in calculating an aerial image 409 while dividing the effective light source was compared with the time in calculating the aerial image 409 without dividing the effective light source.

Figure 10:
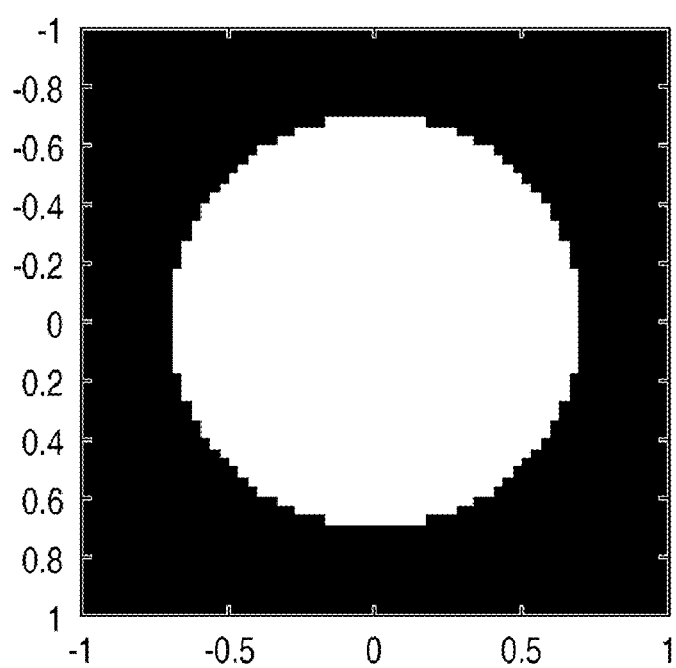
FIG. 10 is a view showing an effective light source used in the second embodiment.

In the second embodiment, assume that the NA of the projection optical system of the exposure apparatus is 0.73 (corresponding to NA information 403), and the wavelength of exposure light is 248 nm (corresponding to λ information 404). The projection optical system has no aberration (corresponding to aberration information 405), the illumination light has no polarization (corresponding to polarization information 406), and a resist to be applied to a wafer is not taken into consideration (corresponding to resist information 407). Circular illumination of σ=0.7 as shown in FIG. 10 is used as the effective light source. Pattern data (target pattern) 401 includes two contact hole patterns shown in FIG. 6B, as in the first embodiment.

The aerial image 409 was calculated without dividing the effective light source shown in FIG. 10. The time required for calculation of the aerial image 409 was about 168 sec.

Figure 11:
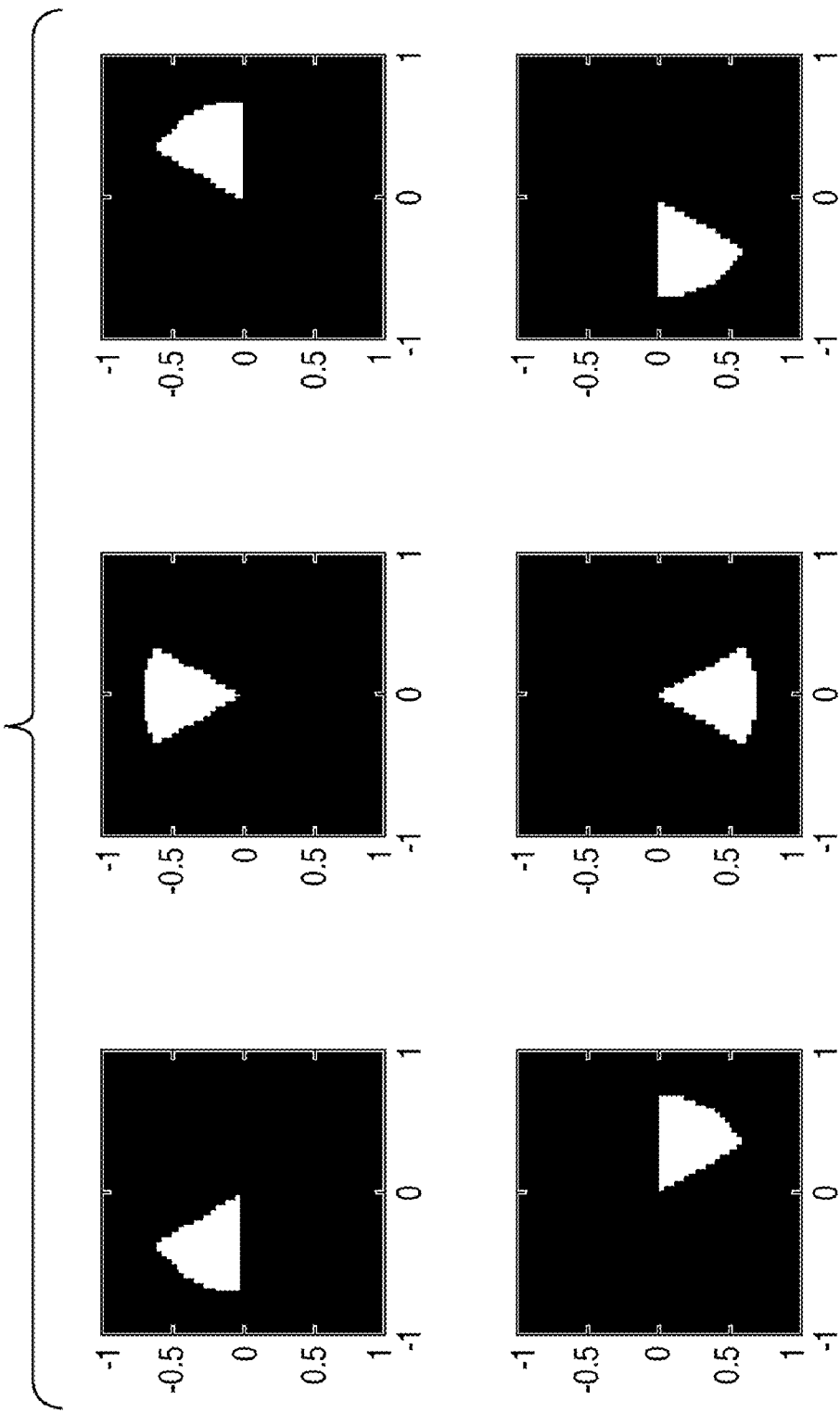
FIG. 11 is a view showing an example of division of the effective light source shown in FIG. 10.

A case will be explained next in which the aerial image 409 was calculated while dividing the effective light source shown in FIG. 10. A case will be examined in which the effective light source shown in FIG. 10 is divided in the angle directions using polar coordinates (polar coordinates having the positive direction of the x-axis as 0° and rotating 360° counterclockwise) of two-dimensional coordinates. More specifically, as shown in FIG. 11, the effective light source shown in FIG. 10 is divided into n parts (n=6 in FIG. 11). When n was changed to 2, 3, 4, 6, 8, and 16, the times required for calculation of the aerial image 409 were 90 sec, 70 sec, 62 sec, 55 sec, 56 sec, 55 sec, and 59 sec. When n became large, the time required for calculation of the aerial image 409 shortened. When n was set to 6 or more, the calculation time shortened to about ⅓ as compared to the case without effective light source division.

Figure 12:
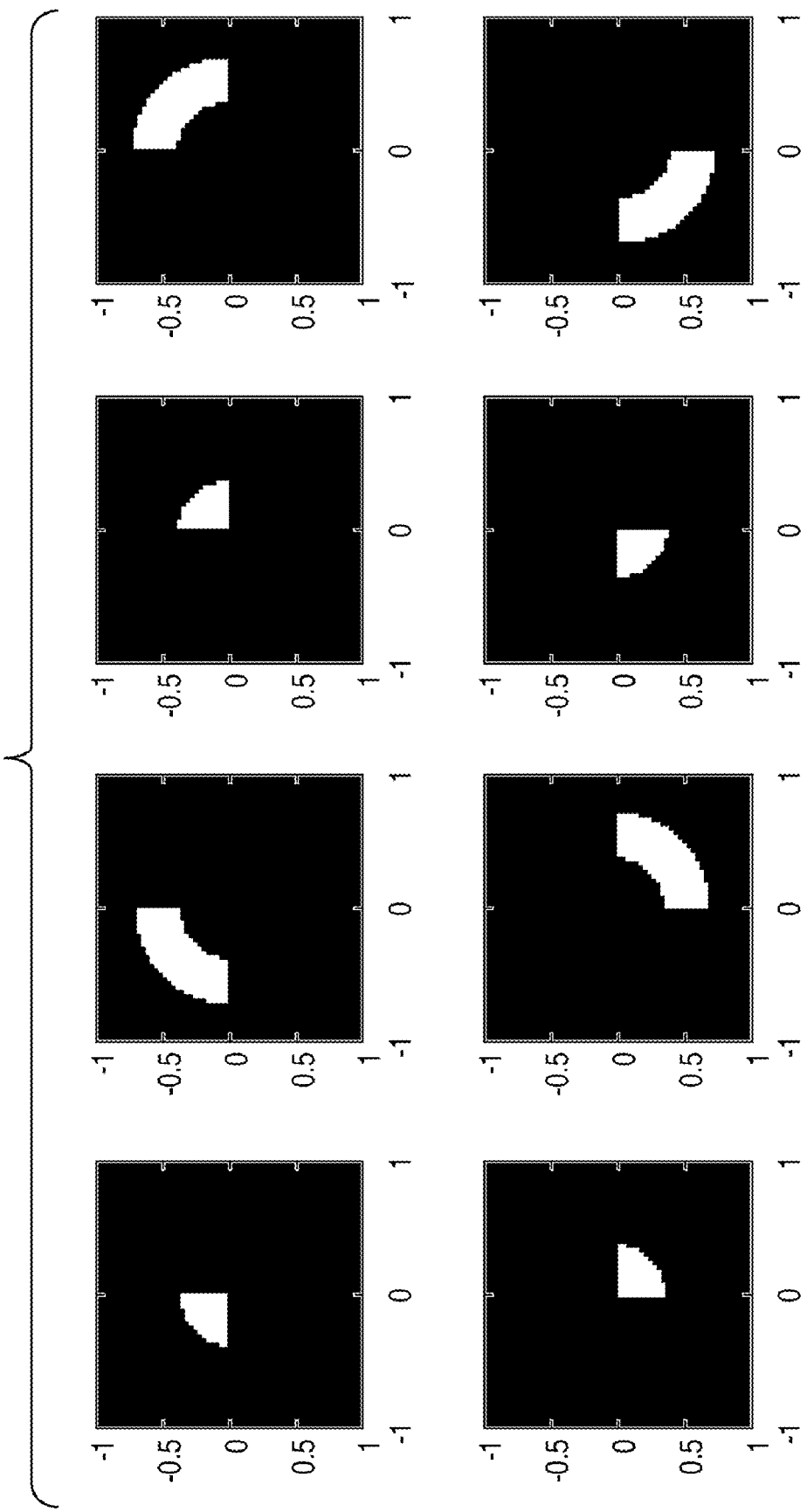
FIG. 12 is a view showing another example of division of the effective light source shown in FIG. 10.

The effective light source shown in FIG. 10 can be divided not only in the angle direction but also in the radial direction. More specifically, as shown in FIG. 12, the effective light source shown in FIG. 10 is divided into n parts (n=4 in FIG. 12) in the angle directions and into m parts (m=2 in FIG. 12) in the radial directions. When (m,n)=(2,8) and (4,4), the times required for calculation of the aerial image 409 were 52 sec and 55 sec. This indicates that division of the effective light source is effective.

On the other hand, when (m,n)=(36,1) (that is, when the effective light source was divided only in the radial directions), the time required for calculation of the aerial image 409 was 73 sec. This is because increasing the number of effective light source divisions does not allow efficient compression of the P operator. More specifically, when (m,n)=(1, 36), the compressed P operator has 51 rows and 4,388 columns. When (m,n)=(36,1), the compressed P operator includes doubled columns (8,613 columns) at maximum. Hence, the effective light source is appropriately divided in accordance with the effective light source.

In a third embodiment, a case will be described in which the effective light source shown in FIG. 10 was divided using a division method (division model) different from the second embodiment.

The two-dimensional coordinates of the effective light source are set by an orthogonal coordinate system (f,g). The effective light source shown in FIG. 10 can be expressed by $f^2+g^2=(0.7)^2$. Hence, $-0.7 \leq f \leq 0.7$, and $-0.7 \leq g \leq 0.7$. Letting M be the number of divisions in the f direction, and M be the number of divisions in the g direction, the effective light source shown in FIG. 10 is divided into rectangles. In this case, the region of a point source set (m,n) (m=1 to M, n=1 to N) is given by $$-0.7+1.4\times(m-1)/M \leq f < -0.7+1.4\times m/M, -0.7+1.4\times(n-1)/N \leq g < -0.7+1.4\times n/N \quad (35)$$

Figure 13:
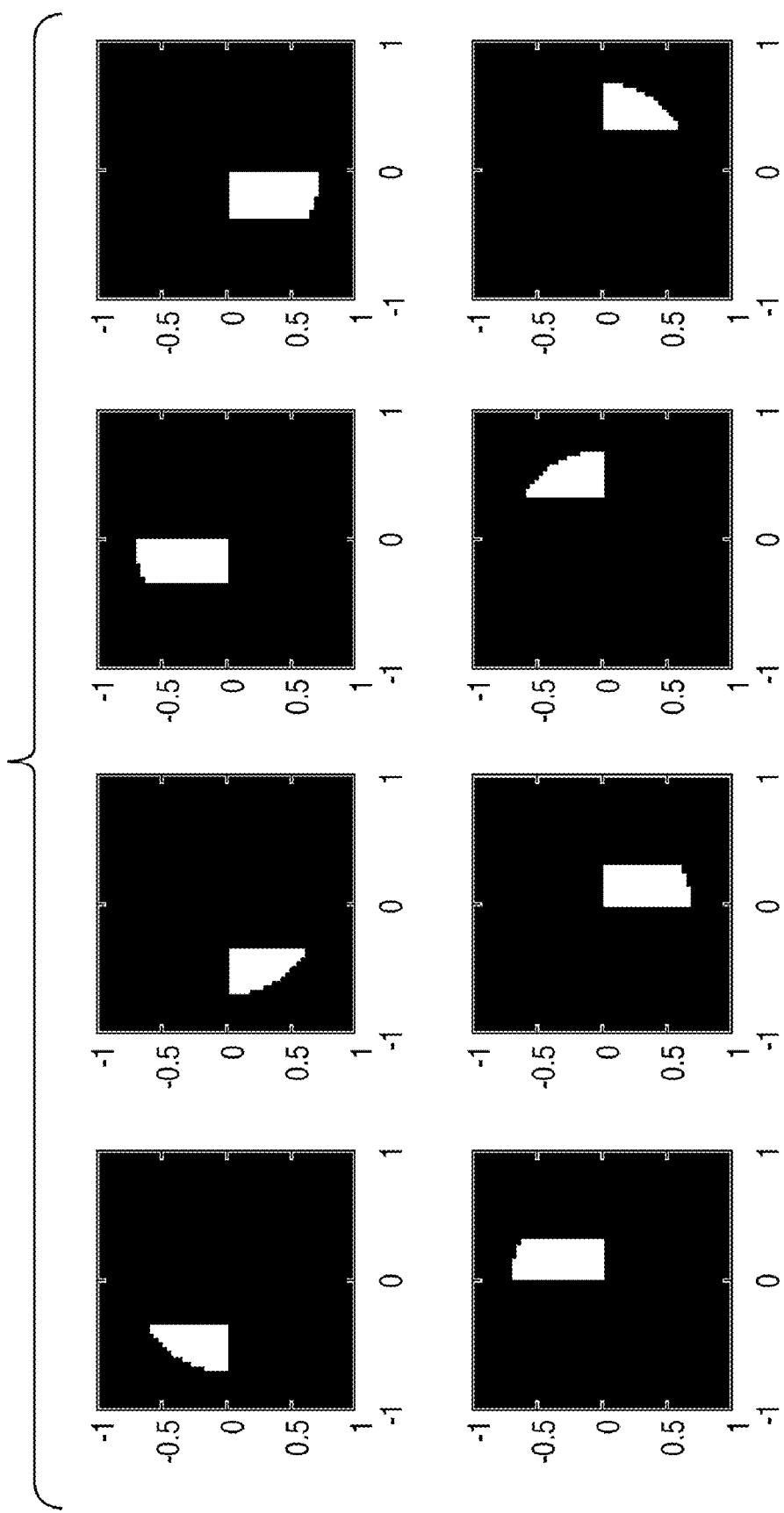
FIG. 13 is a view showing still another example of division of the effective light source shown in FIG. 10.

FIG. 13 is a view showing an example of division of the effective light source shown in FIG. 10. In FIG. 13, (m,n)=(4,2).

The effective light source was divided in accordance with equation (35), and the times required for calculation of the aerial image 409 were obtained. More specifically, when (m,n)=(3,1), (4,1), (6,1), (8,1), (4,2), (8,2), (2,8), (4,4), and (6,6), the times were 73, 65, 59, 60, 53, 53, 52, 52, and 55 sec. That is, it is possible to effectively shorten the time required for calculation of the aerial image 409 even when the effective light source is divided in accordance with equation (35).

The total number Z of divisions of the effective light source is given by Z=m×n. When the total number Z of divisions increases within the range of about Z=3 to 8, the calculation time shortens. However, if Z>8, the effect of shortening the calculation time cannot be made large by increasing the total number Z of divisions. Division in both the x and y directions is more effectible than division in only the x direction. If the total number of divisions is the same, the calculation time is almost the same as in dividing the effective light source in the angle directions (second embodiment).

Figure 14:
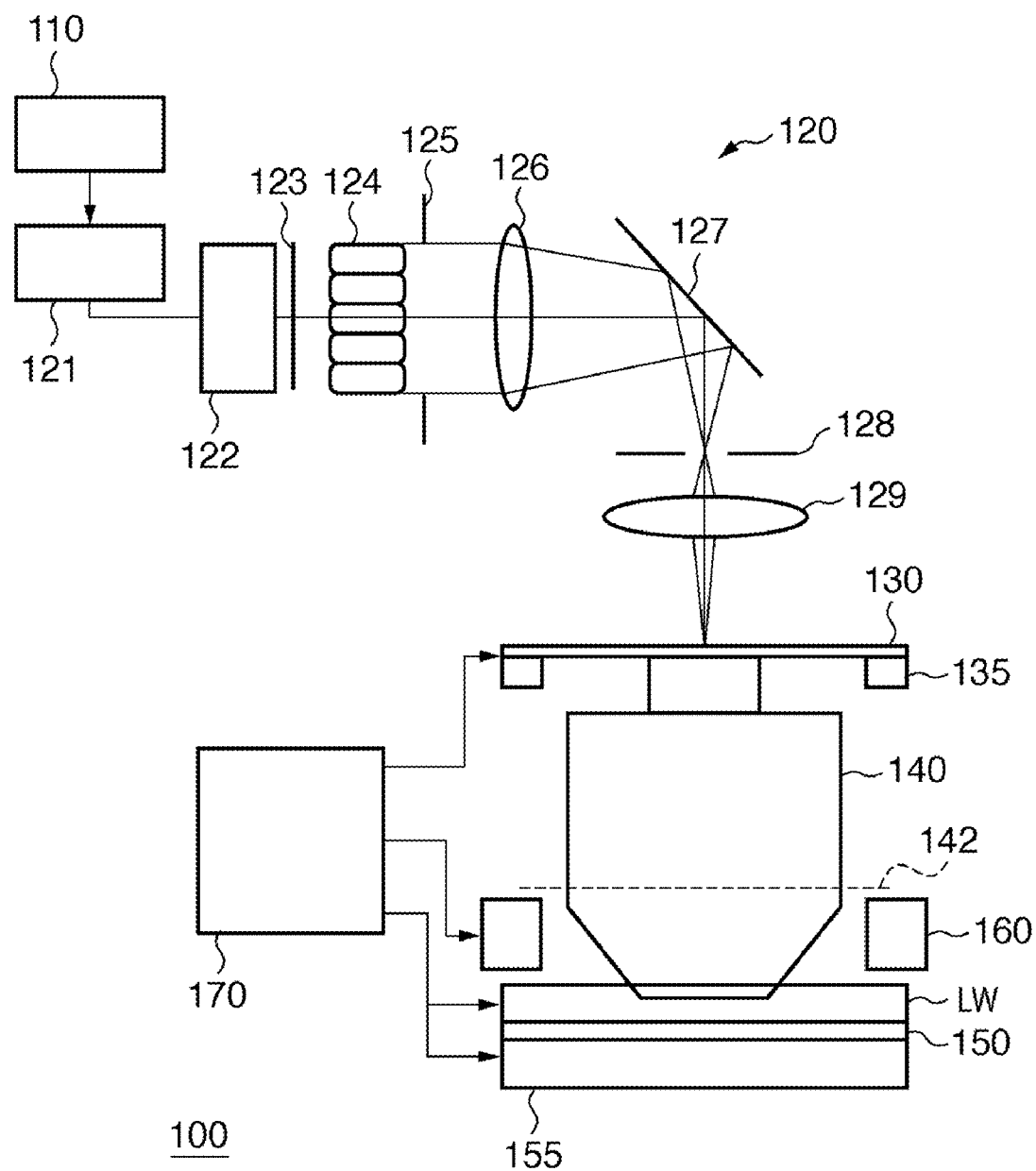
FIG. 14 is a schematic block diagram showing the arrangement of an exposure apparatus.

In a fourth embodiment, an exposure apparatus 100 which executes exposure processing by adjusting exposure conditions based on an aerial image (a light intensity distribution formed on the image plane of the projection optical system) calculated by the above-described processing apparatus 1 will be described. FIG. 14 is a schematic block diagram showing the arrangement of the exposure apparatus 100.

The exposure apparatus 100 is an immersion exposure apparatus which transfers the pattern of a mask 130 onto a wafer 150 by step-and-scan via a liquid LW supplied between a projection optical system 140 and the wafer 150. The exposure apparatus 100 can also use a step-and-repeat method or any other exposure method.

As shown in FIG. 14, the exposure apparatus 100 includes an illumination optical system 120, a mask stage 135 on which the mask 130 is placed, the projection optical system 140, a wafer stage 155 on which the wafer 150 is placed, a liquid supply/recovery unit 160, and a main control system 170. Note that a light source 110 and the illumination optical system 120 constitute an illumination apparatus which illuminates the mask 130 having a circuit pattern to be transferred.

The light source 110 uses an excimer laser such as an ArF excimer laser having a wavelength of about 193 nm or a KrF excimer laser having a wavelength of about 248 nm. The type and the number of light sources 110 are not limited. For example, an $F_2$ laser having a wavelength of about 157 nm is also usable as the light source 110.

The illumination optical system 120 is optical system which illuminates the mask 130 using a light beam from the light source 110. In this embodiment, the illumination optical system 120 includes a beam shaping optical system 121, condensing optical system 122, polarization control unit 123, optical integrator 124, and aperture stop 125. The illumination optical system 120 also includes a condenser lens 126, deflecting mirror 127, masking blade 128, and imaging lens 129. The illumination optical system can implement various kinds of illumination modes such as modified illumination (quadrupole illumination or dipole illumination).

The beam shaping optical system 121 uses, for example, a beam expander including a plurality of cylindrical lenses. The beam shaping optical system 121 converts the aspect ratio of the sectional shape of a parallel beam from the light source 110 into a predetermined value (for example, converts the sectional shape from a rectangle to a square). In this embodiment, the beam shaping optical system 121 shapes light into a light beam having a size and an angle of divergence necessary for illuminating the optical integrator 124.

The condensing optical system 122 including a plurality of optical elements efficiency guides the light beam shaped by the beam shaping optical system 121 to the optical integrator 124. The condensing optical system 122 includes, for example, a zoom lens system and adjusts the distribution of the shape and angle of the light beam to be input to the optical integrator 124.

The polarization control unit 123 includes, for example, a polarization element and is arranged at a position almost conjugate to a pupil plane 142 of the projection optical system 140. The polarization control unit 123 controls the polarized state of a predetermined area of the effective light source formed on the pupil plane 142 of the projection optical system 140.

The optical integrator 124 has a function of uniforming illumination light to illuminate the mask 130 and making the incident light emit while converting its angle distribution into a position distribution. The optical integrator 124 uses, for example, a fly-eye lens whose incident plane and exit plane maintain the relationship of Fourier transform. Note that the fly-eye lens is formed by combining a plurality of rod lenses (i.e., microlens elements). However, the optical integrator 124 may use not the fly-eye lens but an optical rod, diffraction grating, or cylindrical lens array plate including lens sets arranged perpendicular to each other.

The aperture stop 125 is arranged immediately after the exit plane of the optical integrator 124 at a position almost conjugate to the effective light source formed on the pupil plane 142 of the projection optical system 140. The opening shape of the aperture stop 125 corresponds to the light intensity distribution (i.e., effective light source) formed on the pupil plane of the projection optical system 140. In other words, the aperture stop 125 controls the effective light source. The aperture stop 125 is configured to be switchable in accordance with the illumination mode. Without using the aperture stop, the effective light source may be formed by arranging a diffraction optical element (e.g., CGH) or a prism (conical prism) on the preceding stage of the optical integrator 124.

The condenser lens 126 condenses a light beam which has emerged from a secondary light source formed near the exit plane of the optical integrator 124 and passed through the aperture stop 125, and uniformly illuminates the masking blade 128 via the deflecting mirror 127.

The masking blade 128 includes a plurality of movable light shielding plates and is arranged at a position almost conjugate to the mask 130. The masking blade 128 forms an almost rectangular opening corresponding to the effective area of the projection optical system 140. The light beam that has passed through the masking blade 128 is used as illumination light to illuminate the mask 130.

The imaging lens 129 forms, on the reticle 130, an image of the light beam that has passed through the opening of the masking blade 128.

The mask 130 has a circuit pattern and is supported and driven by the mask stage 135. Diffracted light that has been emitted from the mask 130 is projected onto the wafer 150 through the projection optical system 140. The mask 130 and the wafer 150 are arranged to be optically conjugate to each other. The exposure apparatus 100 of a step-and-scan type synchronously scans the mask 130 and the wafer 150, thereby transferring the transfer target circuit pattern from the mask 130 to the wafer 150. Note that if the exposure apparatus 100 is of a step-and-repeat type, it exposes the mask 130 and the wafer 150 while keeping them standstill.

The mask stage 135 supports the mask 130 via a mask chuck and is connected to a driving mechanism (not shown). The driving mechanism (not shown) includes, for example, a linear motor and drives the mask stage 135 in the X-, Y-, and Z-axis directions and the rotational directions of the respective axes. Note that the Y-axis is set in the scanning direction in the plane of the mask 130 or wafer 150, the X-axis is set to be perpendicular to the Y-axis, and the Z-axis is set to be perpendicular to the plane of the mask 130 or wafer 150.

The projection optical system 140 is an optical system which projects the circuit pattern of the mask 130 onto the wafer 150. The projection optical system 140 can use a refraction system, reflection/refraction system, or reflection system. The final lens (final plane) of the projection optical system 140 has a coating to reduce (protect itself from) the influence of the liquid LW supplied from the liquid supply/recovery unit 160.

The wafer 150 is a substrate to which the circuit pattern of the mask 130 is projected (transferred). However, the wafer 150 may be replaced with a glass plate or any other substrate. A resist is applied to the wafer 150.

The wafer stage 155 supports the wafer 150 and moves the wafer 150 in the X-, Y-, and Z-axis directions and the rotational directions of the respective axes using a linear motor, like the mask stage 135.

The liquid supply/recovery unit 160 has a function of supplying the liquid LW to the space between the wafer 150 and the final lens (final plane) of the projection optical system 140. The liquid supply/recovery unit 160 also has a function of recovering the liquid LW supplied to the space between the wafer 150 and the final lens of the projection optical system 140. As the liquid LW, a substance which has a high transmittance to the exposure light, prevents (the final lens of) the projection optical system 140 from being contaminated, and excellently matches the resist process is selected.

The main control system 170 includes a CPU and a memory, and controls the operation of the exposure apparatus 100. For example, the main control system 170 electrically connects the mask stage 135, wafer stage 155, and liquid supply/recovery unit 160, and controls synchronous scanning of the mask stage 135 and the wafer stage 155. The main control system 170 also controls switching between supply, recovery, and stop of the liquid LW based on the scanning direction and speed of the wafer stage 155 during exposure. The main control system 170 receives the light intensity distribution (aerial image) calculated by the processing apparatus 1 and adjusts (controls) the exposure conditions based on the light intensity distribution. For example, the main control system 170 controls the exposure conditions by adjusting the aperture stop, diffraction optical element, and prism included in the illumination optical system 120 so that a desired effective light source is formed. Note that the light intensity distribution (aerial image) calculated by the processing apparatus 1 may be input either by the user or by connecting the processing apparatus 1 to the exposure apparatus 100 to enable data communication and causing the processing apparatus 1 to transmit the light intensity distribution (aerial image) to the exposure apparatus 100. When connecting the processing apparatus 1 to the exposure apparatus 100 to enable data communication, the exposure apparatus 100 includes a known data reception unit, and the processing apparatus 1 includes a known data transmission unit.

As the processing apparatus 1, a computer arranged outside the exposure apparatus 100 is usable. However, the main control system 170 may have the functions of the processing apparatus 1. In this case, the main control system 170 can calculate a light intensity distribution (aerial image) formed on the image plane of the projection optical system 140 in a shorter time using a P operator. In other words, the main control system 170 can speed up partially coherent imaging calculation and shorten the time required for model-based RET. Hence, the exposure apparatus 100 can optimize the exposure conditions (for example, optimize the effective light source for the mask 130) in a short time and improve the throughput.

In the exposure, the illumination optical system 120 illuminates the mask 130 with a light beam emitted by the light source 110. The projection optical system 140 forms, on the wafer 150 via the liquid LW, an image of the light beam which reflects the circuit pattern upon passing through the mask 130. The exposure apparatus 100 can economically provide a device (e.g., semiconductor element, LCD element, image sensing element (CCD or the like), or thin-film magnetic head) at a high throughput. Such a device is manufactured by a process of causing the exposure apparatus 100 to expose a substrate (e.g., wafer or glass plate) with a photoresist (photosensitive agent) being applied on it, a process of developing the exposed substrate, and other known processes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-184152 filed on Jul. 15, 2008, which is hereby incorporated by reference herein in its entirety.

What is claimed is:

1. A non-transitory computer readable medium containing computer-executable instructions which cause a computer to execute processing steps that calculate a light intensity distribution formed on an image plane of a projection optical system when illuminating a mask using an illumination optical system and projecting an image of a pattern of the mask onto a substrate through the projection optical system, the computer readable medium comprising:

computer-executable instructions that determine whether to divide an effective light source into a plurality of areas, the effective light source being formed on a pupil plane of the projection optical system when the mask is not arranged on an object plane of the projection optical system;

computer-executable instructions that divide the effective light source into the plurality of areas upon determining to divide the effective light source into the plurality of areas;

computer-executable instructions that generate, for each of the plurality of areas, a plurality of shifted pupil functions by shifting a pupil function representing a pupil of the projection optical system in accordance with a position of each of divided point sources;

computer-executable instructions that define, for each of the plurality of areas, a matrix including the plurality of shifted pupil functions generated in the generating step by arranging each of the plurality of shifted pupil functions generated in the generating step in each row or each column of the matrix;

computer-executable instructions that compress the defined matrix, for each of the plurality of areas, by deleting a row or a column of the matrix in which all elements are 0;

computer-executable instructions that calculate, for each of the plurality of areas, eigenvalues and eigenfunctions by performing singular value decomposition of the compressed matrix;

computer-executable instructions that calculate, for each of the plurality of areas, the light intensity distribution formed on the image plane of the projection optical system based on a diffracted light distribution of light diffracted by the pattern of the mask and the eigenvalues and the eigenfunctions calculated in the step of calculating the eigenvalues and the eigenfunctions; and computer-executable instructions that composite the light intensity distributions of the plurality of areas which are calculated in the step of calculating the light intensity distributions.

2. The medium according to claim 1, wherein in the determining step, it is determined to divide the effective light source into the plurality of areas when the number of point sources obtained by dividing the effective light source into the plurality of point sources falls within a range designated in advance.

3. The medium according to claim 1, wherein in the dividing step, the effective light source is divided into the plurality of areas in accordance with a division model selected from a plurality of different division models.

4. The medium according to claim 1, wherein in the dividing step, a time taken to execute processing including the generating step, the defining step, the step of calculating the eigenvalues and the eigenfunctions, the step of calculating the light intensity distributions, and the compositing step is executed for each of the plurality of different division models to be used to divide the effective light source into the plurality of areas, and the effective light source is divided into the plurality of areas in accordance with a division model for which the time is shorter than a predetermined time.

5. The medium according to claim 4, wherein the plurality of division models include at least two of a division model for dividing the effective light source into rectangles, a division model for dividing the effective light source into quadrants of two-dimensional coordinates set on the effective light source, a division model for dividing the effective light source in angle directions of the two-dimensional coordinates, and a division model for dividing the effective light source in the angle directions and radial directions of the two-dimensional coordinates.

6. The medium according to claim 1, wherein, in the generation step, the plurality of shifted pupil functions are arranged one-dimensionally.

7. A computer-implemented method of calculating a light intensity distribution formed on an image plane of a projection optical system when illuminating a mask using an illumination optical system and projecting an image of a pattern of the mask onto a substrate through the projection optical system, the method comprising:

determining whether to divide an effective light source into a plurality of areas, the effective light source being formed on a pupil plane of the projection optical system when the mask is not arranged on an object plane of the projection optical system;

dividing the effective light source into the plurality of areas upon determining to divide the effective light source into the plurality of areas;

generating, for each of the plurality of areas, a plurality of shifted pupil functions by shifting a pupil function representing a pupil of the projection optical system in accordance with a position of each of divided point sources;

defining, for each of the plurality of areas, a matrix including the plurality of shifted pupil functions generated in the generating step by arranging each of the plurality of shifted pupil functions generated in the generating step in each row or each column of the matrix;

compressing the defined matrix, for each of the plurality of areas, by deleting a row or a column of the matrix in which all elements are 0;

calculating, for each of the plurality of areas, eigenvalues and eigenfunctions by performing singular value decomposition of the compressed matrix;

calculating, for each of the plurality of areas, the light intensity distribution formed on the image plane of the projection optical system based on a diffracted light distribution of light diffracted by the pattern of the mask and the eigenvalues and the eigenfunctions calculated in the step of calculating the eigenvalues and the eigenfunctions; and compositing the light intensity distributions of the plurality of areas which are calculated in the step of calculating the light intensity distributions.

8. A computer configured to execute the method according to claim 7.

9. A computer-implemented method of calculating a light intensity distribution formed on an image plane of a projection optical system when illuminating a mask using an illumination optical system and projecting an image of a pattern of the mask onto a substrate through the projection optical system, the method comprising:

dividing an effective light source into a plurality of areas, and dividing the effective light source into a plurality of point sources in each of the plurality of areas, the effective light source being formed on a pupil plane of the projection optical system when the mask is not arranged on an object plane of the projection optical system;

generating, for each of the plurality of areas, a plurality of shifted pupil functions by shifting a pupil function representing a pupil of the projection optical system in accordance with a position of each of the point sources;

defining, for each of the plurality of areas, a matrix including the plurality of shifted pupil functions generated in the generating step by arranging each of the plurality of shifted pupil functions generated in the generating step in each row or each column of the matrix;

compressing the defined matrix, for each of the plurality of areas, by deleting a row or a column of the matrix in which all elements are 0;

calculating, for each of the plurality of areas, eigenvalues and eigenfunctions by performing singular value decomposition of the compressed matrix;

calculating, for each of the plurality of areas, the light intensity distribution formed on the image plane of the projection optical system based on a diffracted light distribution of light diffracted by the pattern of the mask and the eigenvalues and the eigenfunctions calculated in the step of calculating the eigenvalues and the eigenfunctions; and compositing the light intensity distributions of the plurality of areas which are calculated in the step of calculating the light intensity distributions.

10. A non-transitory computer readable medium recording a program for causing a computer to execute a method according to claim 9.

11. A computer configured to execute the method according to claim 9.

* * * * *